(12) United States Patent
Mori et al.

(10) Patent No.: US 10,062,760 B2
(45) Date of Patent: Aug. 28, 2018

(54) SEMICONDUCTOR DEVICE

(71) Applicant: ROHM CO., LTD., Kyoto-shi, Kyoto (JP)

(72) Inventors: Seigo Mori, Kyoto (JP); Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/844,078

(22) Filed: Dec. 15, 2017

(65) Prior Publication Data

US 2018/0158915 A1   Jun. 7, 2018

Related U.S. Application Data

(62) Division of application No. 15/304,431, filed as application No. PCT/JP2015/061727 on Apr. 16, 2015.

(30) Foreign Application Priority Data

Apr. 17, 2014   (JP) ................................. 2014-085615

(51) Int. Cl.
*H01L 29/15*    (2006.01)
*H01L 29/16*    (2006.01)
(Continued)

(52) U.S. Cl.
CPC .......... *H01L 29/1608* (2013.01); *H01L 27/04* (2013.01); *H01L 27/0711* (2013.01);
(Continued)

(58) Field of Classification Search
CPC ............. H01L 2924/00; H01L 29/7397; H01L 29/1095; H01L 29/7395;
(Continued)

(56) References Cited

U.S. PATENT DOCUMENTS

2006/0097268 A1   5/2006  Kumar et al.
2008/0014702 A1   1/2008  Kumar et al.
(Continued)

FOREIGN PATENT DOCUMENTS

JP   H0267766 A    3/1990
JP   H09301799 A   11/1997
(Continued)

OTHER PUBLICATIONS

International Search Report issued for International Patent Application No. PCT/JP2015/061727, dated Jul. 21, 2015, 9 pages including English translation.
(Continued)

*Primary Examiner* — Robert Bachner
(74) *Attorney, Agent, or Firm* — Hamre, Schumann, Mueller & Larson, P.C.

(57) ABSTRACT

A semiconductor device according to the present invention includes a semiconductor layer of SiC of a first conductivity type, a plurality of body regions of a second conductivity type formed in the surface portion of the semiconductor layer with each body region forming a unit cell, a source region of the first conductivity type formed in the inner portion of the body region, a gate electrode facing the body region across a gate insulating film, a drain region of the first conductivity type and a collector region of the second conductivity type formed in the rear surface portion of the semiconductor layer such that the drain region and the collector region adjoin each other, and a drift region between the body region and the drain region, wherein the collector region is formed such that the collector region covers a region including at least two unit cells in the x-axis direction along the surface of the semiconductor layer.

11 Claims, 17 Drawing Sheets

(51) Int. Cl.
*H01L 29/78* (2006.01)
*H01L 29/739* (2006.01)
*H01L 27/07* (2006.01)
*H01L 29/12* (2006.01)
*H01L 27/04* (2006.01)

(52) U.S. Cl.
CPC ............ *H01L 29/12* (2013.01); *H01L 29/739* (2013.01); *H01L 29/7393* (2013.01); *H01L 29/78* (2013.01); *H01L 29/7816* (2013.01); *H01L 29/7825* (2013.01)

(58) Field of Classification Search
CPC ..... H01L 2924/00014; H01L 29/66348; H01L 29/0696; H01L 29/0834; H01L 29/7393; H01L 29/66333; H01L 29/7813; H01L 2224/48091
See application file for complete search history.

(56) References Cited

U.S. PATENT DOCUMENTS

| | | |
|---|---|---|
| 2008/0315248 A1 | 12/2008 | Tokura et al. |
| 2009/0272983 A1 | 11/2009 | Kumar et al. |
| 2011/0018005 A1 | 1/2011 | Nakano |
| 2012/0068220 A1 | 3/2012 | Kobayashi et al. |
| 2013/0134478 A1 | 5/2013 | Nakajima et al. |
| 2013/0277688 A1 | 10/2013 | Nakano |
| 2014/0225126 A1 | 8/2014 | Aketa et al. |
| 2014/0287559 A1 | 9/2014 | Nakajima et al. |

FOREIGN PATENT DOCUMENTS

| | | |
|---|---|---|
| JP | 2003303965 A | 10/2003 |
| JP | 2006156962 A | 6/2006 |
| JP | 2006344779 A | 12/2006 |
| JP | 2007266550 A | 10/2007 |
| JP | 2007288158 A | 11/2007 |
| JP | 2008053343 A | 3/2008 |
| JP | 2010074051 A | 4/2010 |
| JP | 2010251517 A | 11/2010 |
| JP | 2011044688 A | 3/2011 |
| JP | 2011049267 A | 3/2011 |
| JP | 2012069579 A | 4/2012 |
| JP | 2013102111 A | 5/2013 |
| JP | 2013110373 A | 6/2013 |
| JP | 2014022708 A | 2/2014 |
| JP | 2015144220 A | 8/2015 |
| WO | 2004109808 A1 | 12/2004 |
| WO | 2011129443 A1 | 10/2011 |

OTHER PUBLICATIONS

International Preliminary Report on Patentability issued for International Patent Application No. PCT/JP2015/061727, dated Oct. 27, 2016, 16 pages including English translation.

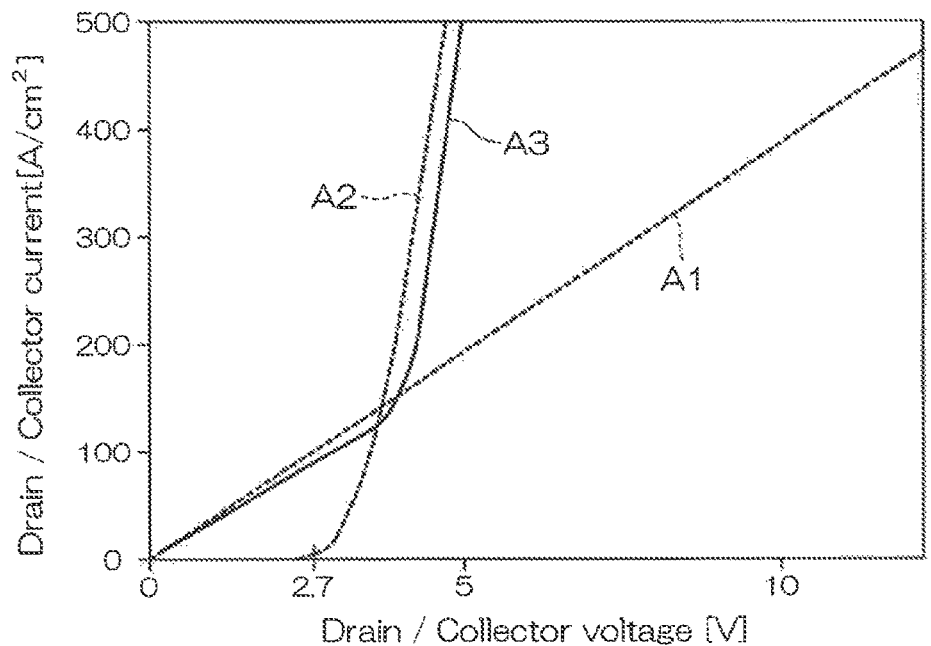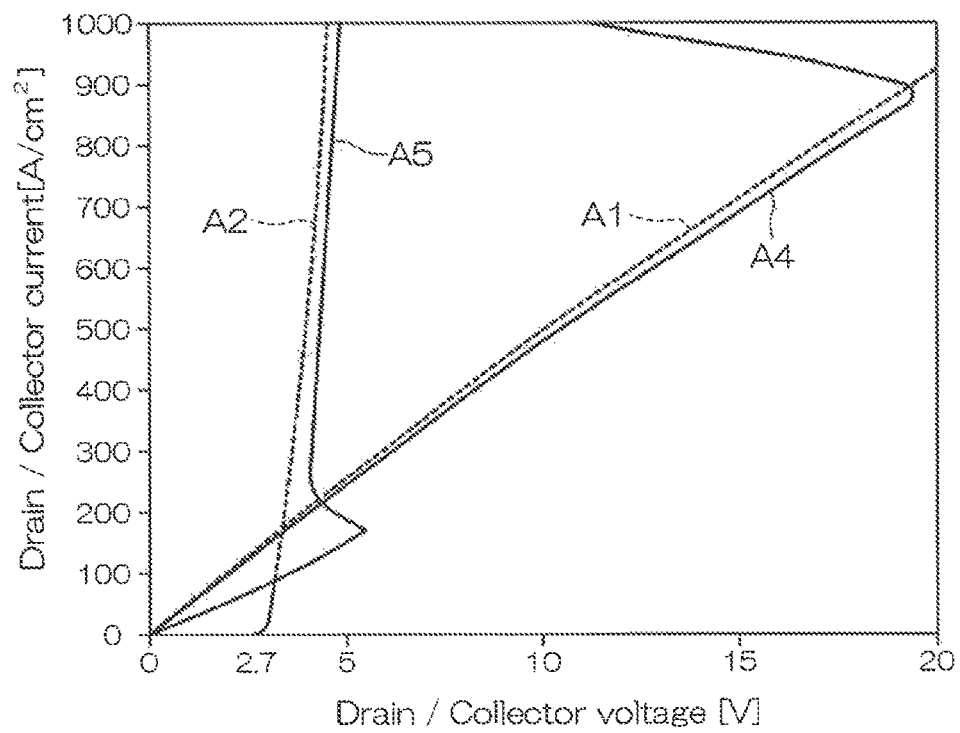

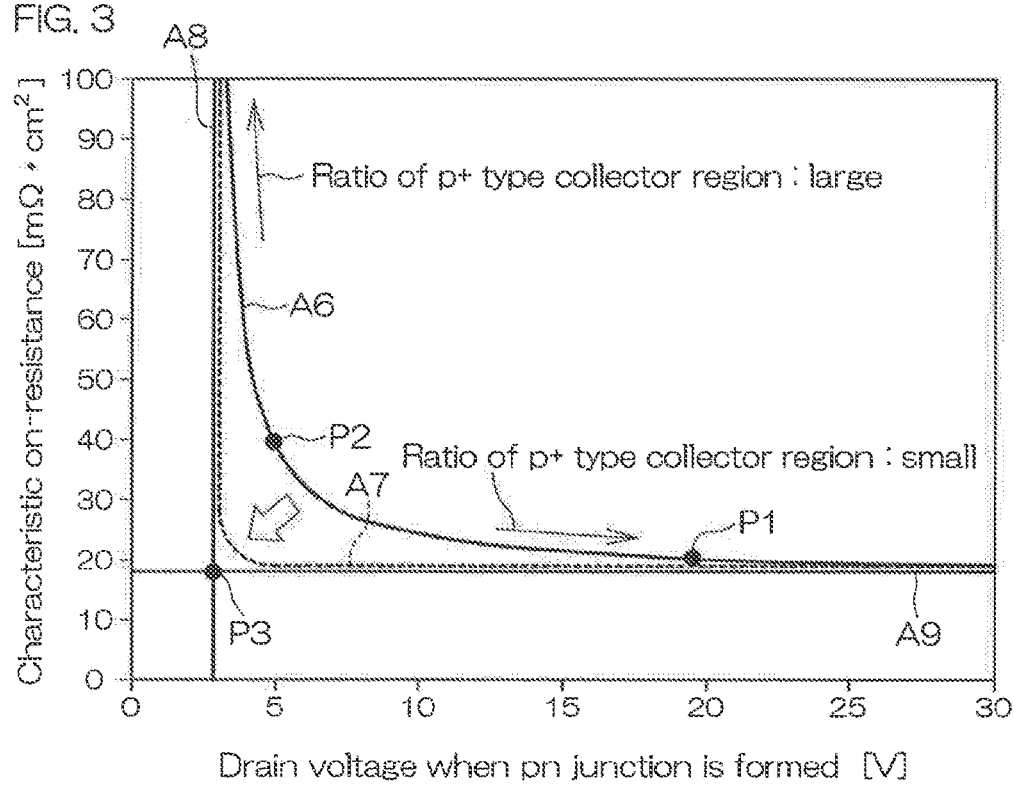

SEMICONDUCTOR DEVICE

TECHNICAL FIELD

The present invention relates to a silicon carbide (SiC) semiconductor device.

BACKGROUND ART

In recent years, a SiC semiconductor device has drawn attention, which is mainly used for systems in various fields related to power electronics such as a motor control system, a power conversion system and so forth.

A patent literature 1 discloses a vertical IGBT, which includes an n-type drift layer formed on a SiC substrate, a p-type base region formed on the upper portion of the drift layer, and an n-type emitter region formed on the upper portion of the base region.

A patent literature 2 discloses a trench gate MOSFET that includes an $n^+$ type SiC substrate, an $n^-$ type base layer formed on the SiC substrate, a p-type body region formed in the surface portion of the base layer, an $n^+$ type source region formed in the surface portion of the body region, a gate trench passing through the source region and the body region from the surface of the base layer, and a gate electrode embedded in the gate trench across a gate insulating film.

PRIOR ART DOCUMENT

Patent Literature

Patent literature 1: Japanese Unexamined Patent Application Publication 2011-49267
Patent literature 2: Japanese Unexamined Patent Application Publication 2011-44688
Patent literature 3: Japanese Unexamined Patent Application Publication 2010-251517
Patent literature 4: Japanese Unexamined Patent Application Publication 2010-74051

SUMMARY OF THE INVENTION

The present invention provides a SiC semiconductor device excellent in both the characteristics of a small current region and the characteristics of a large current region.

Means for Solving the Problem

An embodiment according to the present invention provides a semiconductor device, which includes a semiconductor layer of SiC of a first conductivity type, a plurality of body regions of a second conductivity type formed in the surface portion of the semiconductor layer with each body region forming a unit cell, a source region of the first conductivity type formed in the inner portion of the body region, a gate electrode facing the body region across a gate insulating film, a drain region of the first conductivity type and a collector region of the second conductivity type formed in the rear surface portion of the semiconductor layer such that the drain region and the collector region adjoin each other, and a drift region provided between the body region and the drain region, wherein the collector region is formed such that the collector region covers a region including at least two of the unit cells in the x-axis direction along the surface of the semiconductor layer.

According to this configuration, the semiconductor device has a Hybrid-Metal Oxide Semiconductor (Hybrid-MOS) structure in which a SiC Metal Oxide Semiconductor Field Effect Transistor (MOSFET) and a SiC Insulated Gate Bipolar Transistor (IGBT) are integrated in the same semiconductor layer. More specifically, the SiC-MOSFET is formed of a source region, a drain region, and a gate electrode, and the SiC-IGBT is formed of a source region, a collector region, and a gate electrode. The SiC-MOSFET and the SiC-IGBT are connected in parallel via the semiconductor layer. When the semiconductor device operates as a SiC-IGBT, the source region functions as an emitter region, and the drift region functions as abase region.

A SiC-MOSFET can be effectively used in a low withstand voltage region (for example, 5 kV or less). That is, when a SiC-MOSFET is turned on, a drain current starts to flow from the time when a drain voltage is 0 V, and then linearly increases with an increase in drain voltage. Accordingly, a SiC-MOSFET can exhibit favorable characteristics of a small current region. Whereas, since a drain current linearly increases with an increase in drain voltage, when a SiC-MOSFET is used in a large current region, the area of a semiconductor layer needs to be expanded with an increase in drain voltage applied.

On the other hand, a SiC-IGBT can be effectively used mainly in a high withstand voltage region (for example, 10 kV or greater). That is, since a SiC-IGBT has conductivity modulation characteristics specific to a bipolar transistor, a SiC-IGBT is capable of controlling a large current with a high withstand voltage. Accordingly, a SiC-IGBT can exhibit favorable characteristics of a large current region without expanding the area of a semiconductor layer. Meanwhile, since SiC is a wide gap semiconductor, SiC has a high pn barrier compared to Si. As such, when a SiC-IGBT is used in a small current region, a parasitic diode is formed at the pn junction portion, and therefore a relatively high threshold voltage of pn junction (for example, 2.7 V or greater) is required.

Thereby, with a SiC-MOSFET and a SiC-IGBT integrated in the same semiconductor layer, theoretically, a wide operation range can be achieved from a low withstand voltage region to a high withstand voltage region. That is, a semiconductor device can be provided, which can be used as a high withstand voltage element while carrying out a MOSFET (unipolar) operation in a small current region and carrying out an IGBT (bipolar) operation in a large current region.

However, simply joining the collector region and the drain region of the SiC-MOSFET and the SiC-IGBT may possibly increase an on-resistance or require an extremely high voltage during the transfer from a small current region to a large current region.

Here, in a semiconductor layer wherein a SiC-MOSFET and a SiC-IGBT are formed, an equipotential surface is distributed such that electrical potential increases from the front surface toward the rear surface of a semiconductor layer. Particularly, in the semiconductor layer, the equipotential surface is distributed such that a relatively high equipotential surface spreads concentrically with the drain region as a center. As such, when a relatively narrow collector region is formed, an equipotential surface with almost no difference from the drain voltage applied to the drain region is distributed to cover the collector region.

In this case, the drain region and the collector region have the same electrical potential, and thus a difference in electrical potential that is greater or equal to the threshold voltage of pn junction (that is, 2.7 V) is hardly generated between the collector region and the equipotential surface that covers the collector region, even if the drain voltage is increased. As such, the drain voltage needs to be increased until the difference in electrical potential between the collector region and the equipotential surface becomes greater or equal to the threshold voltage of pn junction. For this purpose, an extremely high voltage becomes necessary during the transfer from a small current region to a large current region.

Here, by forming a collector region so as to cover a region that includes at two unit cells in the x-axis direction along the surface of a semiconductor layer, a relatively low equipotential surface can be widely distributed over the upper end of the collector region. In this case, the difference in electrical potential between the collector region and the equipotential surface can be set closer to the threshold voltage of pn junction, and therefore the pn junction portion (parasitic diode) can be turned on with a relatively small increase in drain voltage. As such, since the transfer from a small current region to a large current region can be carried out with a relatively small drain voltage, a tradeoff relationship between the characteristics of a small current region and the characteristics of a large current region can be improved. As a result, a SiC semiconductor device excellent in both the characteristics of a small current region and the characteristics of a large current region can be provided.

An embodiment according to the present invention provides a semiconductor device, which includes a semiconductor layer of SiC of a first conductivity type, a body region of a second conductivity type formed in the surface portion of the semiconductor layer, a source region of the first conductivity type formed in the inner portion of the body region, a gate electrode facing the body region across a gate insulating film, a drain region of the first conductivity type and a collector region of the second conductivity type formed in the rear surface portion of the semiconductor layer such that the drain region and the collector region adjoin each other, and a drift region between the body region and the drain region, wherein an x-axis width Wc of the collector region along the surface of the semiconductor layer is made at least two times greater than a y-axis thickness Td of the drifter region along the thickness direction of the semiconductor layer.

Even with this configuration, the same effect as the previously described effect can be produced.

According to an embodiment of the present invention, the drain region may have an x-axis width Wd that is greater than or equal to that of the collector region.

With this configuration, the characteristics of a small current region can be improved while maintaining the characteristics of a large current region.

An embodiment according to the present invention provides a semiconductor device, which includes a semiconductor layer of SiC of a first conductivity type, a body region of a second conductivity type formed in the surface portion of the semiconductor layer, a source region of the first conductivity type formed in the inner portion of the body region, a gate electrode facing the body region across a gate insulating film, a drain region of the first conductivity type and a collector region of the second conductivity type formed in the rear surface portion of the semiconductor layer such that the drain region and the collector region adjoin each other, a drift region between the body region and the drain region, and an insulating layer arranged between the drain region and the collector region, the insulating layer being formed deeper than the drain region and the collector region from the rear surface of the semiconductor layer in the y-axis direction along the thickness direction of the semiconductor layer.

According to this configuration, since an insulating layer is formed between the drain region and the collector region, a relatively high equipotential surface expanded from the drain region can be blocked by the insulating layer. Thereby, a relatively high equipotential surface can be prevented from being distributed in the collector region, while at the same time a relatively low equipotential surface can be distributed in the collector region. In this case, since the difference in potential between the equipotential surface and the collector region can be set closer to the threshold voltage of pn junction, the pn junction portion (parasitic diode) can be turned on with a relatively small increase in drain voltage. As such, since the transfer from a small current region to a large current region can be carried out with a relatively small increase in drain voltage, a tradeoff relationship between the characteristics of a small current region and the characteristics of a large current region can be improved. As a result, a SiC semiconductor device excellent in both the characteristics of a small current region and the characteristics of a large current region can be provided.

According to an embodiment of the present invention, the insulating layer may include an insulating film or a high resistance layer.

According to an embodiment of the present invention, the insulating layer may include an insulating material having a dielectric constant lower than SiC.

According to an embodiment of the present invention, the insulating layer may include $SiO_2$.

An embodiment according to the present invention provides a semiconductor device, which includes a semiconductor layer of SiC of a first conductivity type, a body region of a second conductivity type formed in the surface portion of the semiconductor layer, a source region of the first conductivity type formed in the inner portion of the body region, a gate electrode facing the body region across a gate insulating film, a drain region of the first conductivity type and a collector region of the second conductivity type formed in the rear surface portion of the semiconductor layer, and a drift region between the body region and the drain region such that the drain region and the collector region adjoin each other, wherein the upper end of the collector region is positioned closer to the surface of the semiconductor layer than the upper end of the drain region in the y-axis direction along the thickness direction of the semiconductor layer.

According to this configuration, since the upper end of the collector region is positioned closer to the surface of the semiconductor layer than to the upper end of the drain region, the equipotential surface expanding from the drain region can be prevented from reaching the upper end of the collector region. Thereby, a relatively high equipotential surface can be prevented from being distributed in the collector region, while at the same time a relatively low equipotential surface can be distributed in the collector region. In this case, since the difference in potential between the equipotential surface and the collector region can be set closer to the threshold voltage of pn junction, the pn junction portion (parasitic diode) can be turned on with a relatively small increase in drain voltage.

Further, by increasing the thickness from the upper end of the drain region to the upper end of the collector region, the characteristics of an on-resistance can be improved compared to a case where the drain region and the collector region are formed to have the same thickness.

In an embodiment according to the present invention, the rear surface of a semiconductor layer extends across the interface between the drain region and the collector region to make both surfaces flush with each other.

An embodiment according to the present invention may further include a field stop zone that is formed to extend from the drain region to the collector region in the x-axis direction along the surface of the semiconductor layer, and is arranged between the drift region, and the drain region and the collector region.

According to this configuration, a Field Stop (FS) type semiconductor device can be provided. A Non-Punch Through (NPT) type semiconductor device is also known in contrast to a FS type semiconductor device. In the case of an NPT type semiconductor device, the semiconductor layer needs to be formed relatively thick to prevent the semiconductor device from being punched through with a depletion layer generated from the interface between the body region and the drift region, reaching the bottom surface of the semiconductor layer. In contrast, in the case of a FS type semiconductor device, since the extension of the depletion layer can be blocked by a field stop zone, a punch-through can be suppressed. Therefore, a FS type semiconductor device allows for a thinner semiconductor layer compared to an NPT type semiconductor device.

An embodiment according to the present invention may include a planar-gate structure in which the gate electrode is arranged on the semiconductor layer.

An embodiment according to the present invention may include a trench-gate structure in which the gate electrode is embedded in a trench formed in the semiconductor layer.

BRIEF DESCRIPTION OF THE DRAWINGS

FIG. 2A is a graph illustrating theoretical characteristics of drain voltage (collector voltage) vs. drain current (collector current) in the Hybrid-MOS structure, which can be derived from each characteristic of a SiC-MOSFET and a SiC-IGBT that are individually manufactured.

FIG. 2B is a graph illustrating actual characteristics of drain voltage (collector voltage) vs. drain current (collector current) in the Hybrid-MOS structure.

FIG. 3 is a graph illustrating the actual characteristics of threshold voltage of pn junction vs. characteristic on-resistance in the Hybrid-MOS structure.

EMBODIMENT FOR PRACTICING THE INVENTION

Hereinafter, an embodiment according to the present invention will be specifically discussed with reference to the accompanying drawings.

Figure 1:
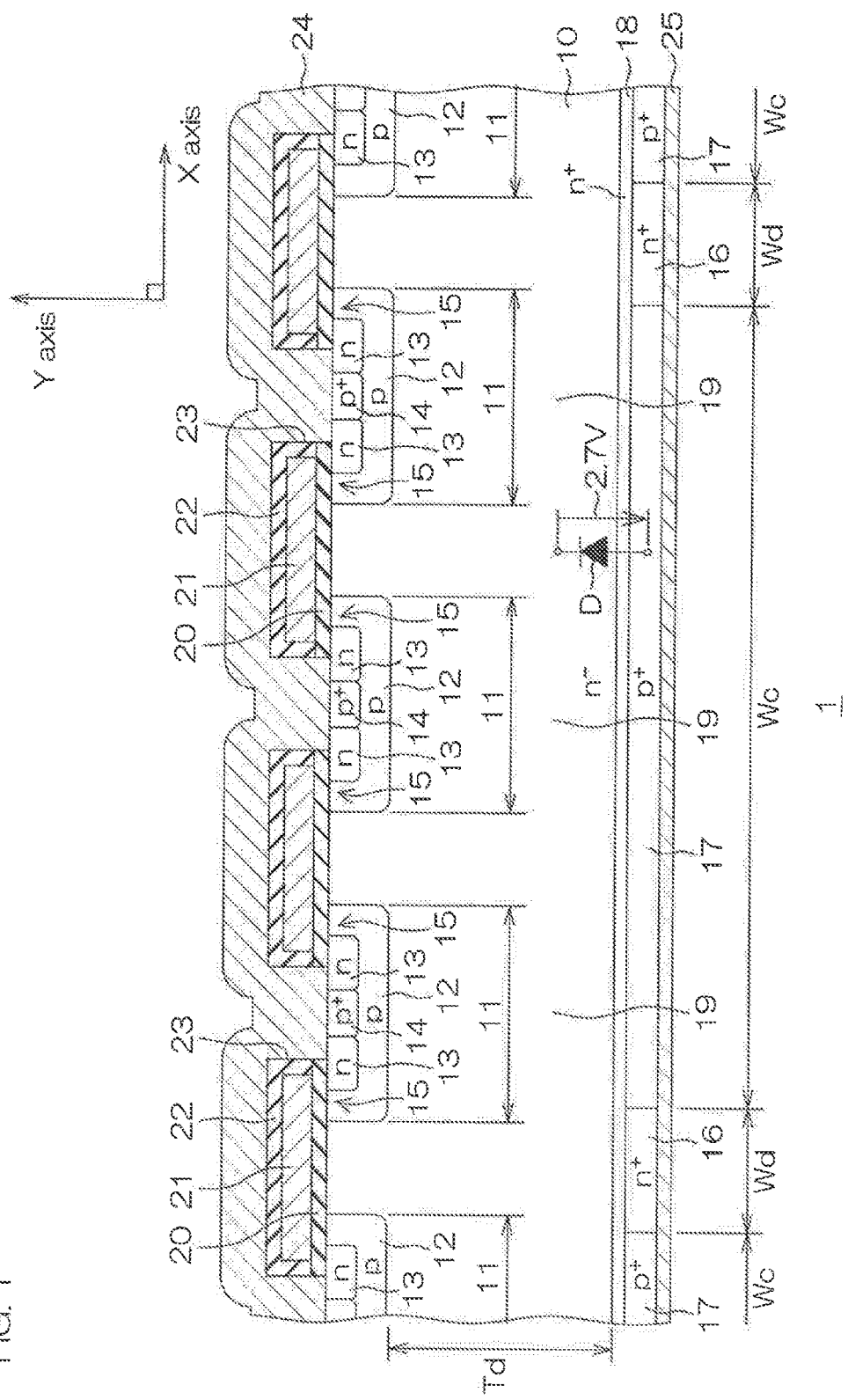
FIG. 1 is a schematic cross-sectional view of a SiC semiconductor device according to an embodiment of the present invention.

FIG. 1 is a schematic cross-sectional view of a SiC semiconductor device 1 according to an embodiment of the present invention.

As shown in FIG. 1, a SiC semiconductor device 1 includes an n⁻ type SiC semiconductor layer 10 with front and rear surfaces. A plurality of p-type body regions 12 with each forming a unit cell 11 is formed in the surface portion of the SiC semiconductor layer 10.

The p-type body regions 12 are formed spaced apart from each other in the surface portion of SiC semiconductor layer 10. A n-type source region 13 and P⁺ type contact region 14 are formed in the inner portion of the p-type body region 12. The n-type source region 13 is formed at a position away from the peripheral edge of the p-type body region 12. A p-type channel region 15 is positioned in a region between the peripheral edge of the n-type source region 13 and the peripheral edge of the p-type body region 12. The P⁺ type contact region 14 is positioned in the inner portion of the n-type source region 13 and is formed to pass through the n-type source region 13. The P⁺ type contact region 14 has a higher impurity concentration than the p-type body region 12. Both the n-type source region 13 and the P⁺ type contact region 14 are formed shallow than the p-type body region 12.

Mutually adjoining n⁺ type drain regions 16 and P⁺ type collector regions 17, and an n⁺ type field stop (FS) region 18 extending over the n⁺ type drain regions 16 and the P⁺ type collector regions 17 are formed in the rear surface portion of the SiC semiconductor layer 10. The rear surface of the SiC semiconductor layer 10 extends across the interface between the $n^+$ type drain regions 16 and the $P^+$ type collector regions 17 to make both surfaces flush with each other.

The FS region 18 is formed to have a uniform thickness in the x-axis direction along the surface of the SiC semiconductor layer 10 so as to come in contact with the upper end of the $n^+$ type drain regions 16 and the upper end of the $P^+$ type collector regions 17. A region between the FS region 18 and the unit cells 11 (p-type body region 12) is a $n^-$ type drift region 19. The y-axis thickness Td of the $n^{31}$ type drift region 19 in the y-axis direction along the thickness direction of the SiC semiconductor layer 10 is, for example, 10 µm-100 µm (46 µm in this embodiment).

The $n^+$ type drain region 16 is formed beneath a region between mutually adjacent unit cells 11 (p-type body regions 12). The x-axis width Wd of the $n^+$ type drain region 16 in the x-axis direction along the surface of the SiC semiconductor layer 10 is, for example, 10 µm-100 µm. In this embodiment, the upper end of the $n^+$ type drain region 16 is positioned at the same depth as the upper end of the $P^+$ type collector regions 17 in the y-axis direction along the thickness direction of the SiC semiconductor layer 10.

The $P^+$ type collector regions 17 forms a pn junction portion with the SiC semiconductor layer 10. That is, a parasitic diode is formed in the pn junction portion. The $P^+$ type collector regions 17 is formed to have an area greater than the $n^+$ type drain region 16 in the x-axis direction along the surface of the SiC semiconductor layer 10. More specifically, the $P^+$ type collector regions 17 is formed to cover a region including at least two unit cells 11 in the x-axis direction. The x-axis width Wc of the $P^+$ type collector regions 17 in the x-axis direction along the surface of the SiC semiconductor layer 10 is, for example, 50 µm-100 µm. The x-axis width Wc of the $P^+$ type collector regions 17 is preferably established so as to satisfy the following expression in relationship to the y-axis thickness Td of the $n^-$ type drift region 19: x-axis width Wc>y-axis thickness Td×2

Such $n^+$ type drain region 16 and $P^+$ type collector regions 17 are formed by the following method. First, $n^+$ type SiC substrate is prepared. Next, the SiC is epitaxially grown with n-type impurities being injected therein, and thus the $n^-$ type SiC semiconductor layer 10 is formed on the SiC substrate. Next, a MOS structure including the p-type body region 12, the n-type source region 13, the later-described gate insulating film 20, gate electrode 21, source electrode 24 and so forth is formed in the SiC semiconductor layer 10, and thereafter the SiC substrate is ground until the SiC semiconductor layer 10 is exposed. The SiC substrate may also be removed by dry etching instead of the grinding of the SiC substrate.

Next, n-type impurities are selectively injected in the rear surface portion of the SiC semiconductor layer 10 to thereby form the FS region 18.

Next, an ion injection mask is formed on the rear surface side of the SiC semiconductor layer 10, the ion injection mask selectively provided with openings corresponding to regions where the $n^+$ type drain region 16 is formed. N-type impurities are injected through the ion injection mask. After the impurities are injected, the ion injection mask is removed.

Next, an ion injection mask is formed on the rear surface side of the SiC semiconductor layer 10, the ion injection mask selectively provided with openings corresponding to regions where the $p^+$ type collector region 17 is formed. P-type impurities are injected through the ion injection mask. After the impurities are injected, the ion injection mask is removed.

Next, laser annealing is selectively applied to the regions where the n-type impurities and p-type impurities are injected. Thereby, the n-type impurities and p-type impurities are activated so that the $n^+$ type drain region 16 and $p^+$ type collector region 17 are formed.

The SiC semiconductor layer 10 has a higher density than a semiconductor layer of Si, and thus has characteristics that impurities are hardly diffused. As such, by adjusting the injection conditions and the annealing conditions for impurities using the characteristics, the thickness of n-type impurities and p-type impurities can be easily adjusted. Thereby, the $n^+$ type drain region 16 and the $p^+$ type collector region 17 can be accurately formed.

Again, referring to FIG. 1, a plurality of gate electrodes 21 is formed to face the p-type channel region 15 across the gate insulating film 20 on the SiC semiconductor layer 10. The gate insulating film 20 may include, for example, a silicon oxide film, a silicon nitride film, a silicon oxynitride film, a hafnium oxide film, an aluminum film, a tantalum oxide film and so forth. Further, the gate electrode 21 may include, for example, a polysilicon having lowered resistance with impurities injected.

Each gate electrode 21 faces a region extending over the SiC semiconductor layer 10 outside the p-type body region 12, the p-type body region 12, and the n-type source region 13. Further the gate electrode 21 includes an overlapped portion protruded from a boundary line between the n-type source region 13 and the p-type body region 12 toward the n-type source region 13. The insulating film 22 is formed on the SiC semiconductor layer 10 so as to cover the gate electrode 21.

The insulating film 22 has a contact hole 23 formed so as to selectively expose a portion of the n-type source region 13 and the $p^+$ type contact region 14. The source electrode 24 is formed on the insulating film 22.

The source electrode 24 gets into the contact hole 23 from the surface of the insulating film 22, and forms an ohmic contact with the n-type source region 13 and the $p^+$ type contact region 14 in the contact hole 23. Meanwhile, a drain electrode 25 is formed on the rear surface side of the SiC semiconductor layer 10. The drain electrode 25 forms an ohmic contact with the $n^+$ type drain region 16 and the $p^+$ type collector region 17.

According to this configuration, the SiC semiconductor device 1 has a hybrid metal oxide semiconductor (Hybrid-MOS) structure in which a SiC metal oxide semiconductor field effect transistor (SiC-MOSFET) and a SiC insulated gate bipolar semiconductor (SiC-IGBT) are integrated in the same SiC semiconductor layer 10. The Hybrid-MOS structure is a planar-gate structure.

More specifically, the SiC-MOSFET is formed by the n-type source region 13, the $n^+$ type drain region 16, and the gate electrode 21, and the SiC-IGBT is formed by the n-type source region 13, the $p^+$ type collector region 17, and the gate electrode 21. That is, the SiC-MOSFET and the SiC-IGBT are connected in parallel via the SiC semiconductor layer 10. When the SiC semiconductor device 1 functions as the SiC-IGBT, the n-type source region 13 (source electrode 24) functions as the n-type emitter region (emitter electrode), and the $n^-$ type drift region 19 functions as $n^-$ type base region.

Next, in the light of the electrical characteristics in a case where the SiC-MOSFET and the SiC-IGBT are individually manufactured, the theoretical electrical characteristics and the actual electrical characteristics of the Hybrid-MOS structure will be discussed.

FIG. 2A is a view illustrating the theoretical characteristics of drain voltage (collector voltage) vs. drain current (collector current) in the Hybrid-MOS structure, which can be derived from each characteristic of a SiC-MOSFET and a SiC-IGBT that are individually manufactured. The drain voltage (collector voltage) implies a voltage applied to the drain electrode 25 with the source electrode 24 as a reference voltage (for example 0 V).

The SiC-MOSFET is effective as an element used mainly in a low withstand voltage region (for example, 5 kV or less). In the case of SiC-MOSFET, as can be seen from a straight line A1 shown as a dashed line in FIG. 2A, the drain current begins to flow when the drain voltage is 0 V, and linearly increases with the increase of the drain voltage. As such, the SiC-MOSFET can exhibit the favorable characteristics of a small current region. Meanwhile, since the drain current linearly increased with the increase of the drain voltage, when the SiC-MOSFET is used in a large current region, the area of the SiC semiconductor layer 10 needs to be expanded with an increase in drain voltage applied.

On the other hand, the SiC-IGBT can be effectively used mainly in a high withstand voltage region (for example, 10 kV or greater). That is, since the SiC-IGBT has conductivity modulation characteristics specific to a bipolar transistor, the SiC-IGBT is capable of controlling a large current with a high withstand voltage. As can be seen from a curved line A2 shown by a dashed line in FIG. 2A, in the case of the SiC-IGBT, when the collector voltage exceeds approximately 2.7 V, the collector current shows precipitous rise characteristics. Therefore, the SiC-IGBT can exhibit the favorable characteristics of a large current region without expanding the area of the SiC semiconductor layer 10.

Meanwhile, since SiC is a wide gap semiconductor, SiC has a higher pn barrier. As such, when using SiC in a small current region, a higher threshold voltage of pn junction (approximately 2.7 V) is required. That is, to switch on a parasitic diode D (see FIG. 1) formed between the $p^+$ type collector region 17 and the SiC diode layer 10, the threshold voltage of pn junction (approximately 2.7 V) is required.

From these, it can be seen that a wide operation range from a low withstand voltage region to a high withstand voltage region can be theoretically created by integrating the SiC-MOSFET and the SiC-IGBT in the same SiC semiconductor layer. That is, it can be seen that a semiconductor device can be provided, which is capable of being used as a high withstand voltage element while performing a MOSFET (unipolar) operation in a small current region, and performing an IGBT (bipolar) operation in a large current region. The theoretical characteristics are represented by a curved line A3 shown as a solid line in FIG. 2A.

Referring to the theoretical curved line A3, it can be seen that the SiC-MOSFET is turned on at 0 through 3 V and thus favorable characteristics in a small current region can be achieved. It can also be seen that by setting a voltage applied to a pn junction portion to a voltage more than or equal to the voltage required for forming the pn junction (approximately 3 V or more), the SiC-IGBT is turned on, and favorable characteristics in a large current region can be achieved.

FIG. 2B is a graph illustrating actual characteristics of drain voltage (collector voltage) vs. drain current (collector current) in the Hybrid-MOS structure. The drain voltage (collector voltage) implies a voltage applied to the drain electrode 25 with the source electrode 24 as a reference voltage (for example 0 V). In FIG. 2B, the straight line A1 and the curved line A2 are continuously shown in dashed lines.

A curved line A4 and a curved line A5 shown in solid lines in FIG. 2B, indicate the characteristics of a SiC semiconductor device in which the x-axis width Wd of the $n^+$ type drain region 16 and the x-axis width Wc of the $p^+$ type collector region 17 are formed to satisfy a relational expression: x-axis width Wd+x-axis width Wc<<12 μm.

Referring to the curved line A4, it can be seen that although the curved line A4 exhibits favorable small current characteristics (favorable on-resistance), an extremely high threshold voltage of pn junction (approximately 19 V) is required for the transfer from a small current region to a large current region. On the other hand, referring to the curved line A5, it can be seen that the threshold voltage of pn junction required for the transfer from a small current region to a large current region is improved, however, the small current characteristics are degraded compared to the curved line A4.

As can be seen from FIG. 2B, the characteristics of the SiC semiconductor device vary with each x-axis width Wd, Wc of the $n^+$ type drain region 16 and the $p^+$ type collector region 17. As such, it can be seen that some ingenuity is required in making the $n^+$ type drain region 16 and the $p^+$ type collector region 17 in order to move these curved lines A4, A5 closer to the theoretical curved line A3 shown in FIG. 2A. In this regard, the inventors found that the characteristics of a small current region and the characteristics of a large current region are in the tradeoff relationship as shown in FIG. 3.

FIG. 3 is a graph illustrating the actual characteristics of threshold voltage of pn junction vs. characteristic on-resistance in the Hybrid-MOS structure. The characteristic on-resistance is defined as the inclination of drain current-drain voltage curve when the drain voltage is 0 V.

As described in FIG. 2B, the $n^+$ type drain region 16 and the $p^+$ type collector region 17 satisfies the relational expression in association with each x-axis width Wd, Wc: x-axis width Wd+x-axis width Wc<<12 μm. That is, the x-axis width Wc of the $p^+$ type collector region 17 is formed to satisfy the relational expression with respect to the y-axis thickness Td: x-axis width Wc<<2×y-axis thickness Td. A curved line A6 shown as a solid line in FIG. 3 illustrates the actual characteristics when satisfying the relational expression: x-axis width Wc<<2×y-axis thickness Td.

Referring to the curved line A6, it can be seen that if an extremely greater ratio of the area of the $n^+$ type drain region 16 to the $p^+$ type collector region 17 is set, the characteristics get closer to that of the SiC-MOSFET. That is, a favorable characteristic on-resistance (favorable characteristics of a small current region) can be obtained, however, an extremely high voltage is required during the transfer to a large current region.

It can also be seen that if an extremely greater ratio of the area of the $p^+$ type collector region 17 to the $n^+$ type drain region 16 is set, the characteristics get closer to that of the SiC-IGBT. That is, although a pn junction can be formed with a relatively low drain voltage, a characteristic on-resistance significantly increases (small current characteristics decrease).

A point P1 in the curved line A6 corresponds to the curved line A4 in the graph shown in FIG. 2B; the value of the characteristic on-resistance is approximately 20 mΩ·cm²; and the drain voltage necessary for the threshold voltage of pn junction is 19 V. Whereas, a point P2 in the curved line A6 corresponds to the curved line A5 in the graph shown in FIG. 2B; the drain voltage in the formation of the pn junction is 5 V; and the value of the characteristic on-resistance is approximately 40 mΩ·cm².

As can be seen from the curved line A6, the characteristics of a small current region and the characteristics of a large current region are in the tradeoff relationship. Even if the ratio of the area of the p⁺ type collector region 17 to the n⁺ type drain region 16 is changed, the characteristics only fluctuate in the direction of the point P1 or in the direction of the point P2 so that the tradeoff relationship cannot be substantially improved.

A curved line A7 shown as a dashed line in FIG. 3 exhibits actual characteristics in which the x-axis width Wc of the p⁺ type collector region 17 satisfies a relational expression: x-axis width Wc>2×y-axis thickness Td. Referring to the curved line A7, it can be seen that the tradeoff relationship is substantially improved compared to the curved line A6. That is, the curved line A7 is moved closer to a straight line A8 representing the lower limit (approximately 2.7 V) of the threshold voltage of pn junction (SiC-IGBT) and a straight ling A9 representing the lower limit (approximately 18 mΩ·cm²) of the characteristic on-resistance (SiC-MOSFET) compared to the curved line A6.

It can be seen that if the value of the threshold voltage of pn junction and the value of the characteristic on-resistance can be moved closer along this curved line A7 to a point P3 at which the straight line A8 and the straight line A9 intersect with each other, the excellent characteristics of a small current region and characteristics of a large current region can be achieved.

Focusing on this, the inventors prepared a plurality of SiC semiconductor devices in which the ratio of the area of the p⁺ type collector region 17 to the n⁺ type drain region 16 is sequentially increased, and carried out a simulation for each SiC semiconductor device.

Figure 4:
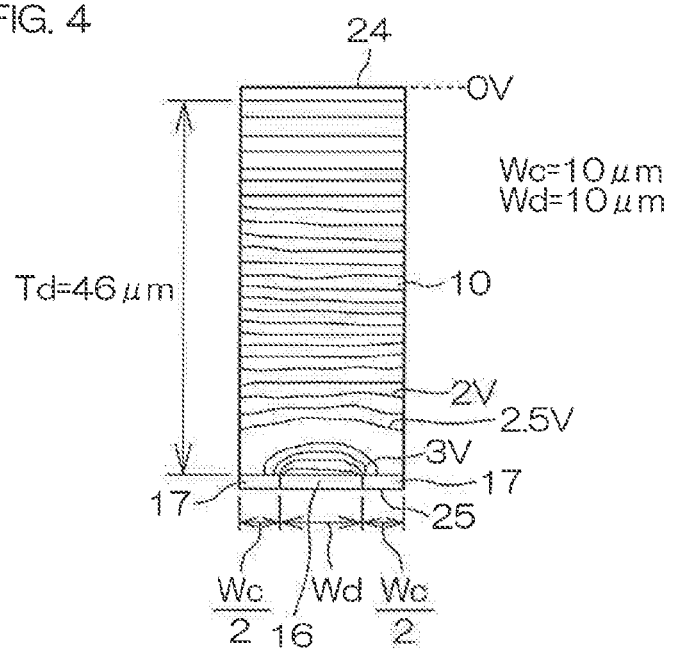
FIG. 4 is a view illustrating the distribution of electrical potential when changing the ratio of the area of the drain region to the collector region.
Figure 5:
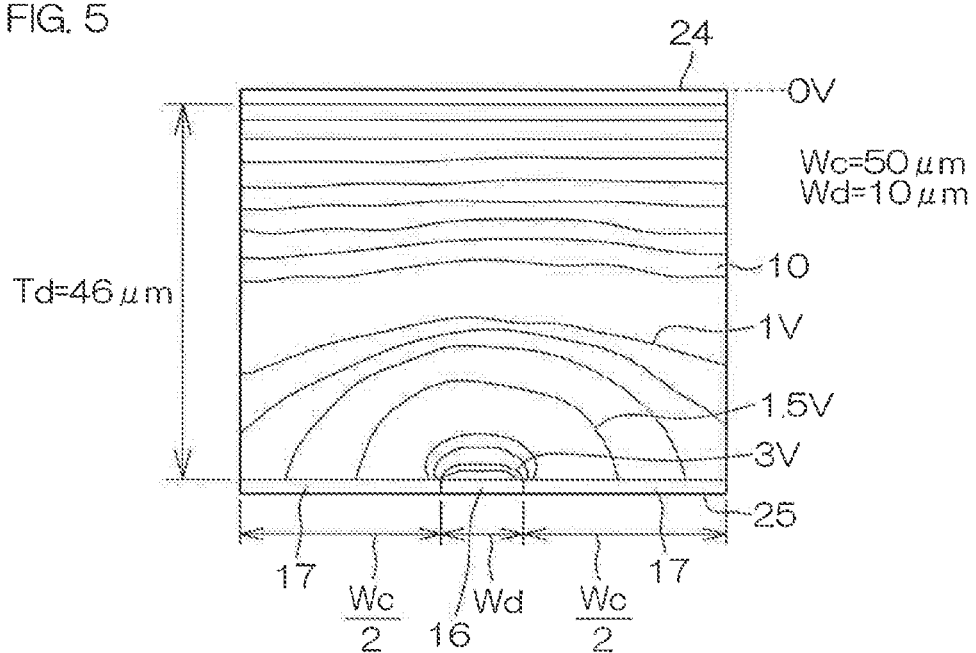
FIG. 5 is a view illustrating the distribution of electrical potential when changing the ratio of the area of the drain region to the collector region.
Figure 6:
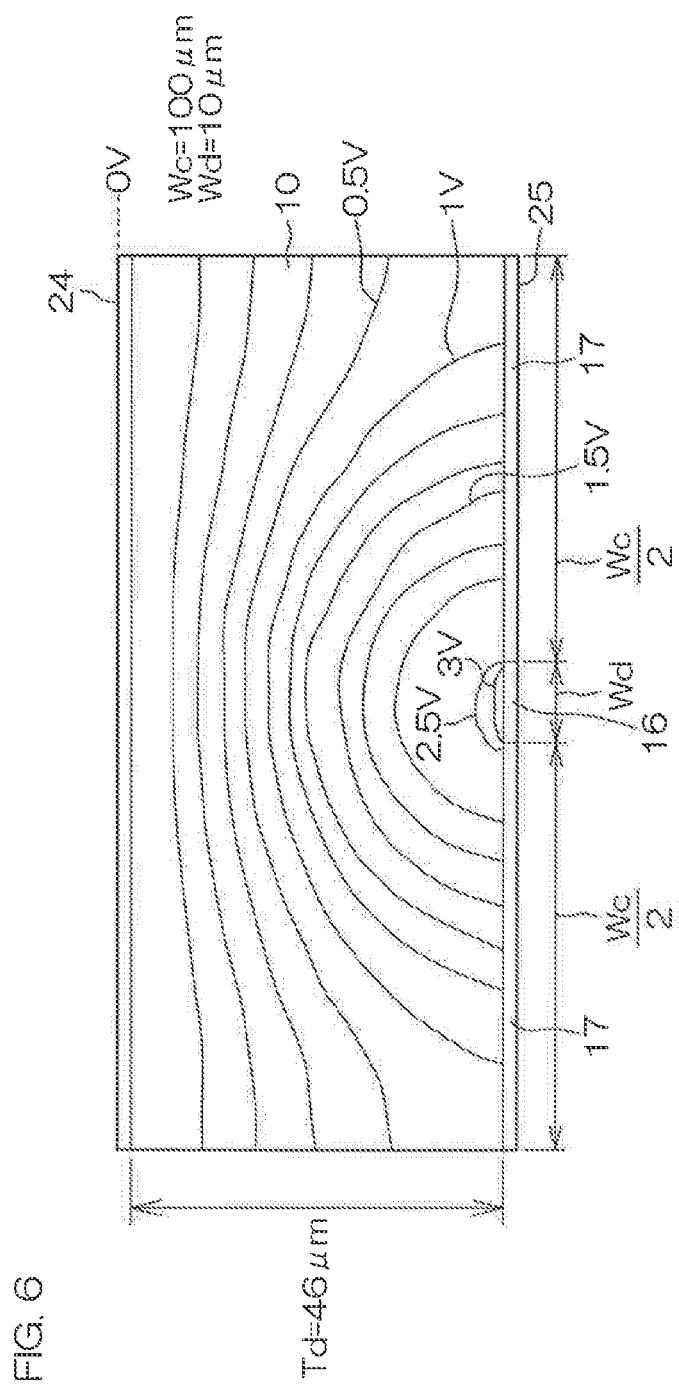
FIG. 6 is a view illustrating the distribution of electrical potential when changing the ratio of the area of the drain region to the collector region.

FIGS. 4 through 6 are views illustrating the distribution of electrical potential when changing the ratio of the area of the p⁺ type collector region 17 to the n⁺ type drain region 16. In FIGS. 4 through 6, structures except with major structures are omitted for the purpose of illustration.

The x-axis width Wc of the p⁺ type collector region 17 in FIG. 4 is 10 μm. The x-axis width Wc of the p⁺ type collector region 17 in FIG. 5 is 50 μm. The x-axis width Wc of the p⁺ type collector region 17 in FIG. 6 is 100 μm. Any of the x-axis widths Wd of the n⁺ type drain region 16 in FIGS. 4 through 6 are 10 μm. Any of the y-axis thickness Td of the n type drift region 19 are 46 μm.

FIGS. 4 through 6 show the distribution of potential when a voltage of approximately 3 V is applied to the drain electrode 25 with the source electrode 24 as a reference (=0 V). As shown in FIGS. 4 through 6, the equipotential surface is distributed to gradually increase from the source electrode 24 toward the drain electrode 25. Further, the equipotential surface that has a relatively high potential is concentrically distributed with the n⁺ type drain region 16 as the center.

According to FIG. 4, an equipotential surface with approximately 2.5 V is distributed over the upper end of the p⁺ type collector region 17. Whereas, in FIG. 5, an equipotential surface with approximately 0.5 V through 2 V is widely distributed over the upper end of the p⁺ type collector region 17. Therefore, it can be seen that the potential difference between the p⁺ type collector region 17 and the equipotential surface is greater. Further according to FIG. 6, an equipotential surface with approximately 0.5 V through 2 V is further widely distributed over the upper end of the p⁺ type collector region 17. Therefore, it can be seen that the potential difference between the p⁺ type collector region 17 and the equipotential surface is further greater compared to FIG. 4 and FIG. 5.

Figure 7:
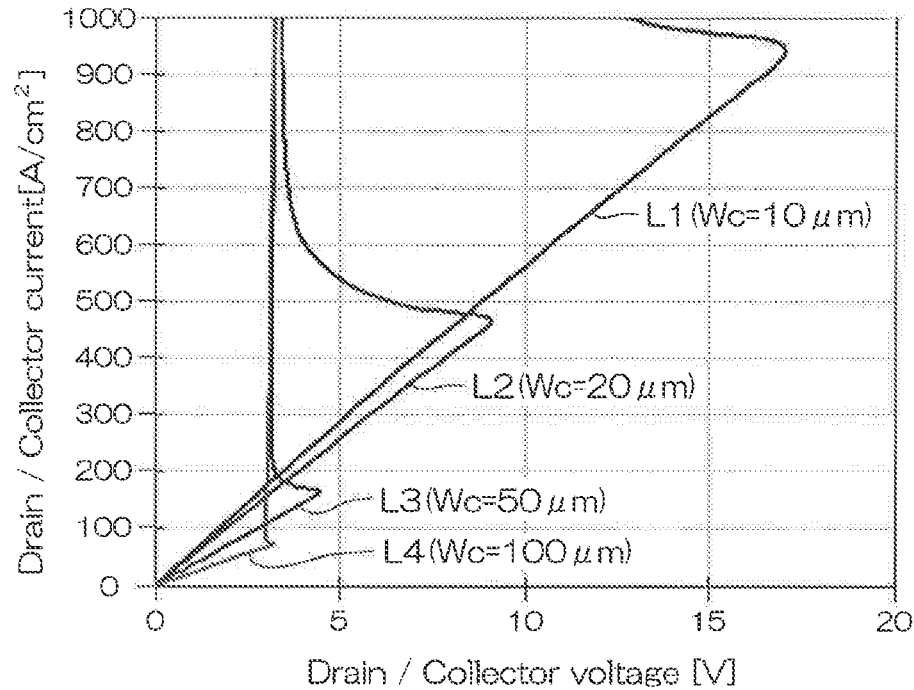
FIG. 7 is a graph illustrating the characteristics of drain voltage (collector voltage) vs. drain current (collector current) when changing the ratio of the area of the collector region to the drain region.

FIG. 7 is a graph reflecting the results of these simulations. FIG. 7 is a graph illustrating the characteristics of drain voltage (collector voltage) vs. drain current (collector current) when changing the ratio of the area of the p⁺ type collector region 17 to the n⁺ type drain region 16.

A curved line L1 exhibits characteristics when the x-axis width Wc of the p⁺ type collector region 17 is 10 μm (see FIG. 4); a curved line L2 exhibits characteristics when the x-axis width Wc of the p⁺ type collector region 17 is 20 μm; a curved line L3 exhibits characteristics when the x-axis width Wc of the p⁺ type collector region 17 is 50 μm (see FIG. 5); and a curved line L4 exhibits characteristics when the x-axis width Wc of the p⁺ type collector region 17 is 100 μm (see FIG. 6).

According to the graph shown in FIG. 7, the drain voltage required for the transfer to a large current region decreases as the x-axis width Wc of the p⁺ type collector region 17 increases.

According to the structure shown in FIG. 4, there is almost no difference between the equipotential surface distributed over the upper end of the p⁺ type collector region 17, and the drain voltage applied onto the n⁺ type drain region 16. With this configuration, the n⁺ type drain region 16 and the p⁺ type collector region 17 have the same potential, and thus even if the drain voltage is increased, a potential difference greater than or equal to the threshold voltage of pn junction (that is 2.7 V) is hardly generated between the p⁺ type collector region 17 and the equipotential surface.

As such, the drain voltage needs to be increased until the potential difference between the p⁺ type collector region 17 and the equipotential surface becomes greater than or equal to the threshold voltage of pn junction, thereby requiring an extremely high voltage in the transfer from a small current region to a large current region. As shown in FIG. 7, it can be seen that the potential difference between the p⁺ type collector region 17 and the equipotential surface covering the p⁺ type collector region 17 does not become greater than or equal to the threshold voltage of pn junction unless the drain voltage increases up to approximately 19 V in the structure depicted in FIG. 4.

In contrast, according to the structure shown in FIG. 6, a relatively low equipotential surface can be distributed over the upper end of the p⁺ type collector region 17. With this structure, the potential difference between the p⁺ type collector region 17 and the equipotential surface can be made to approach the threshold voltage of pn junction, and thus the pn junction portion (parasitic diode D) can be turned on by a relatively small drain voltage (3.0 through 3.5 V). Thereby, the transfer from a small current region to a large current region is smoothly carried out.

Figure 8:
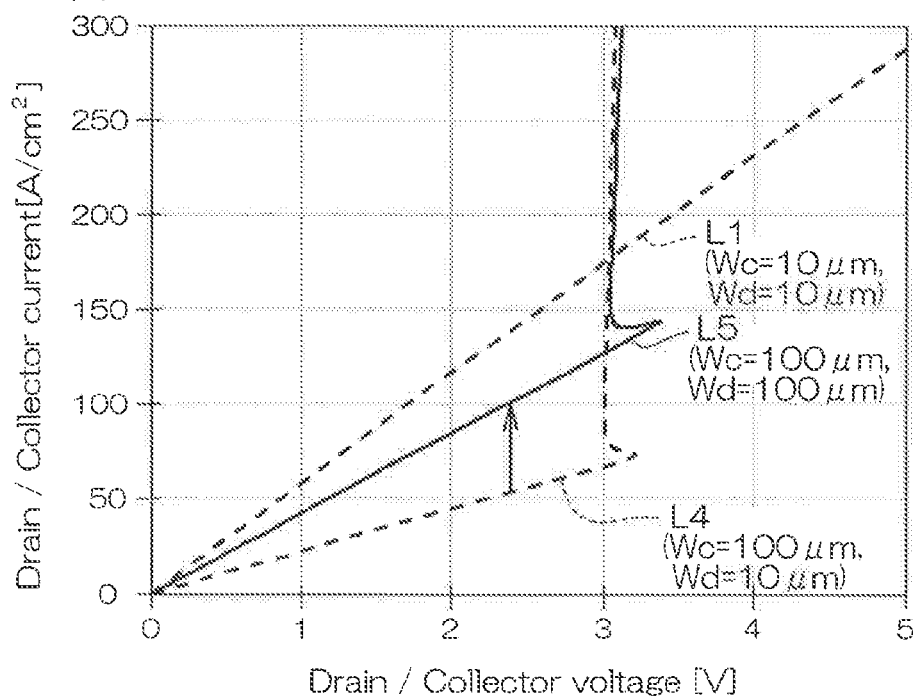
FIG. 8 is a graph illustrating the characteristics of drain voltage (collector voltage) vs. drain current (collector current) when changing the width of the drain region.
Figure 9:
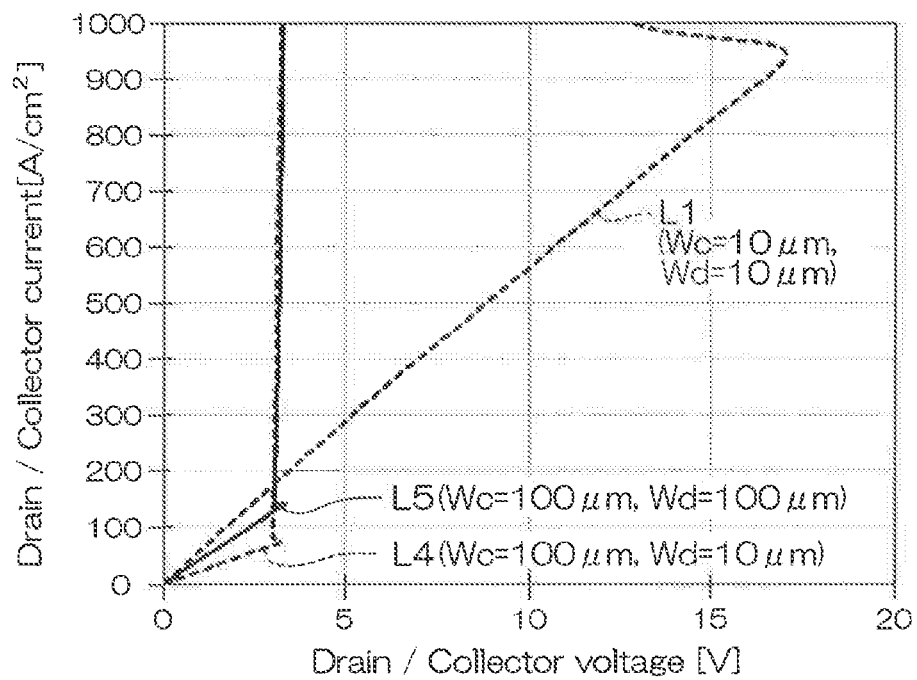
FIG. 9 is a graph illustrating the characteristics of a large current region in FIG. 8.

The graphs shown in FIG. 8 and FIG. 9 exhibit the characteristics of drain voltage (collector voltage) vs. drain current (collector current) when changing the x-axis width Wd of the n⁺ type drain region 16 from 10 μm to 100 μm with the x-axis width Wc of the p⁺ type collector region 17 maintained at 100 μm.

FIG. 8 is a graph illustrating the characteristics of drain voltage (collector voltage) vs. drain current (collector current) when changing the x-axis width Wd of the n⁺ type drain region 16. FIG. 9 is a graph illustrating the characteristics of a large current region in FIG. 8.

A curved line L5 shown as a solid line in each graph of FIGS. 8 and 9 exhibits the characteristics where the x-axis width Wc of the p+ type collector region 17 is 100 µm, and the x-axis width Wd of the n+ type drain region 16 is 100 µm. In each graph shown in FIGS. 8 and 9, the curved lines L1, L4 shown in the graph of FIG. 7 are shown in dashed lines.

Referring to the graph shown in FIG. 8, it was found that a drain current (collector current) in a small current region increased by increasing the x-axis width Wd of the n+ type drain region 16 and thereby relatively decreasing the ratio of the x-axis width Wc of the p+ type collector region 17. In other words, it was found that the drain current (collector current) in a small current region increased due to a decrease in the value of characteristic on-resistance by relatively increasing the ratio of the x-axis width Wd of the n+ type drain region 16. In addition, it was found as shown in FIG. 9 that the characteristics in a large current region stayed pretty much the same.

As a result, it was found that the characteristics in a small current region could be improved while maintaining a suitable threshold voltage of pn junction (3.0V through 3.5 V) by relatively decreasing the ratio of the x-axis width Wc of the p+ type collector region 17. That is, it can be seen that the characteristics in a small current region can be improved by forming the x-axis width Wd of the n+ type drain region 16 to have a width greater than or equal to the x-axis width Wc of the p+ type collector region 17.

As described above, according to the SiC semiconductor device 1, by forming the p+ type collector region 17 to cover a region including at least two unit cells 11 in the x-axis direction along the surface of the SiC semiconductor layer 10, a relatively low equipotential surface can be widely distributed over the upper end of the p+ type collector region 17.

From another point of view, the x-axis width Wc of the p+ type collector region 17 along the surface of the SiC semiconductor layer 10 is made at least two times greater than the y-axis thickness Td of the n− type drift region 19 along the thickness direction of the SiC semiconductor layer 10, and thereby a relatively low equipotential layer can be widely distributed over the upper end of the p+ type collector region 17.

With this configuration, the potential difference between the p+ type collector region 17 and the equipotential surface can be made to approach the threshold voltage of pn junction, and thus the pn junction portion (parasitic diode D) can be turned on with a relatively small increase in drain voltage, as shown in FIG. 7. In this way, the transfer from a small current region to a large current region can be carried out with a relatively small drain voltage, and thereby the tradeoff relationship between the characteristics of a small current region and the characteristics of a large current region can be improved. As a result, the SiC semiconductor device 1 excellent in both the characteristics of a small current region and the characteristics of a large current region can be provided.

Further, as shown in FIGS. 8 and 9, by forming the n+ type drain region 16 to have the x-axis width Wd that is greater than or equal to the x-axis width Wc of the p+ type collector region 17, the characteristics of a small current region can be improved while maintaining the characteristics of a large current region.

Further, as shown in FIG. 1, the FS region 18 is formed to extend over the n+ type drain region 16 and the p+ type collector region 17. Thereby, a field stop (FS) type SiC semiconductor 1 can be provided. A non-punch through (NPT) type SiC semiconductor device, which does not have the FS region 18, is known as opposed to the FS type Semiconductor device 1.

In the case of NPT type SiC semiconductor device, the SiC semiconductor layer 10 needs to be formed to have a relatively large thickness, which prevents a depletion layer generated from the interface between the p-type body region 12 and the n− type drift region 19 from reaching the bottom surface of the SiC semiconductor layer 10 thereby punching through the device. In contrast, in the case of the FS type SiC semiconductor 1, the expansion of a depletion layer can be stopped by the FS region 18, the occurrence of punch-through can be suppressed. Therefore, according to the FS type SiC semiconductor device 1, the thickness of the semiconductor layer 10 can be reduced compared to an NPT type SiC semiconductor device.

Figure 10:
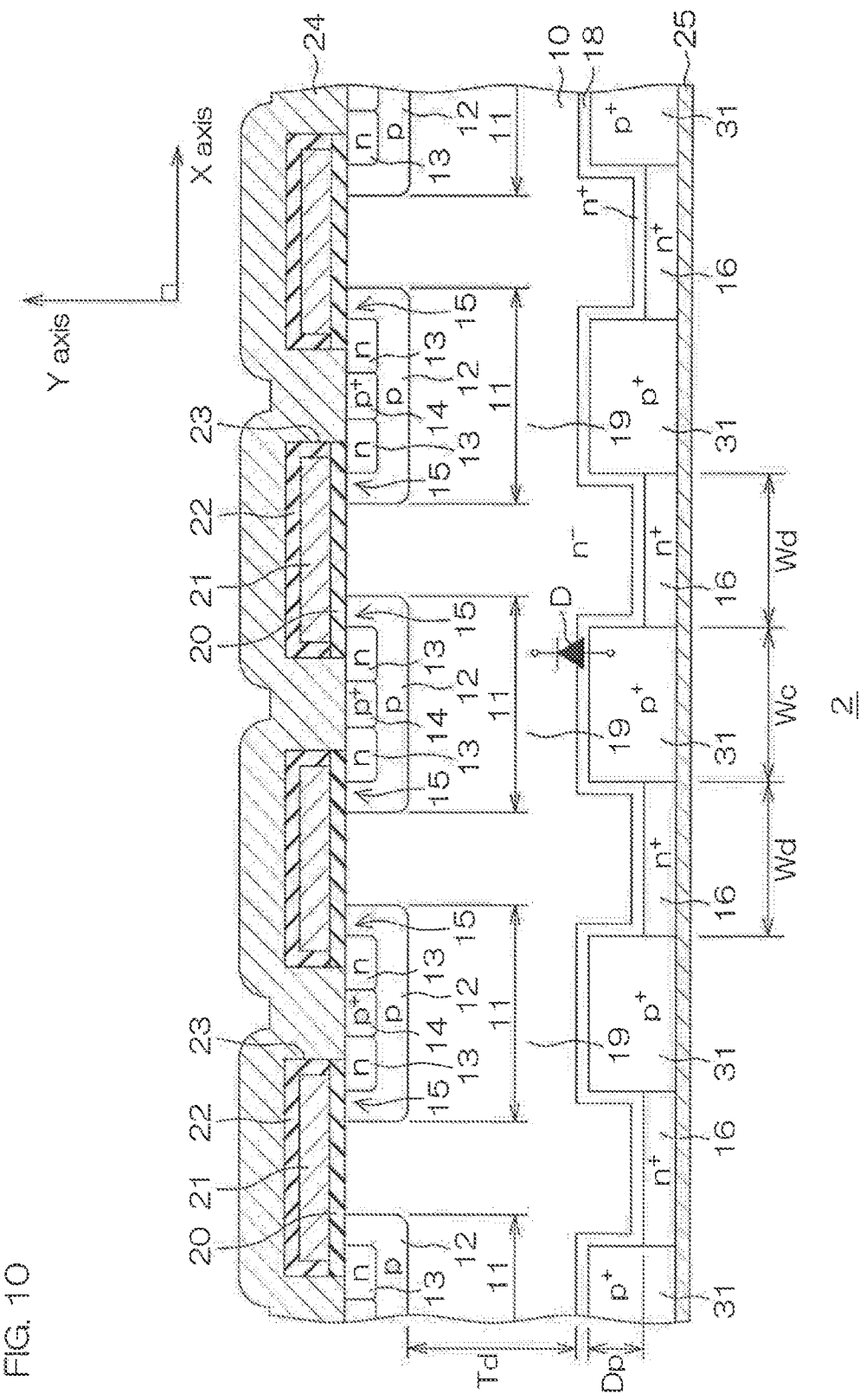
FIG. 10 is a schematic cross-sectional view of a SiC semiconductor device according to an embodiment of the present invention.

FIG. 10 is a schematic cross-sectional view of a SiC semiconductor device 2 according to an embodiment of the present invention.

The SiC semiconductor device 2 is different from the previously described SiC semiconductor device 1 in that a p+ type collector region 31 is formed in place of the p+ type collector region 17. Other components are the same as those shown in the SiC semiconductor device 1. In FIG. 10, the same reference numerals are applied to the components corresponding to each component shown in FIG. 1 previously described and the descriptions for such components will be omitted.

As shown in FIG. 10, a plurality of p+ type collector regions 31 and a plurality of n+ type drain regions 16 are formed to adjoin each other in the rear surface portion of the SiC semiconductor layer 10. Each p+ type collector region 31 is formed right below each unit cell 11 (p-type body region 12), and faces the unit cell 11 across the n− type drift region 19. The x-axis width Wc of the p+ type collector region 31 in the x-axis direction along the surface of the SiC semiconductor layer 10 is, for example 10 µm.

FIG. 10 shows an example where the x-axis width Wc of the p+ type collector region 31 is made narrower than the width of the p-type body region 12. The x-axis width Wc of the p+ type collector region 31 (the ratio of the area of the p+ type collector region 31 to the area of the n+ type drain region 16) can be changed in accordance with the y-axis thickness Td of the n− type drift region 19 as necessary. Therefore, when the y-axis thickness Td of the n− type drift region 19 is made thicker, the p+ type collector region 31 may be made wider than the width of the p-type body region 12.

The upper end of the p+ type collector region 31 is positioned closer to the surface of the SiC semiconductor layer 10 than the upper end of the n+ type drain region 16 in the y-axis direction along the thickness direction of the SiC semiconductor layer 10. A y-axis thickness Dp from the upper end of the n+ type drain region 16 to the upper end of the p+ type collector region 31 in the y-axis direction is, for example, 0 µm through 10 µm (0 µm<y-axis thickness Dp≤10 µm). The FS region 18 according to this embodiment is formed along the upper end and the lateral part of the p+ type collector region 31, and the upper end of the n+ type drain region 16.

Such a p+ type collector region 31 can be formed in the same manner as the previously described manner. That is, the p+ type collector region 31 can be formed by adjusting injection conditions when injecting p-type impurities (for example, doping energy, dose amount and so forth), and annealing conditions (for example, annealing temperature, time and so forth).

Figure 11:
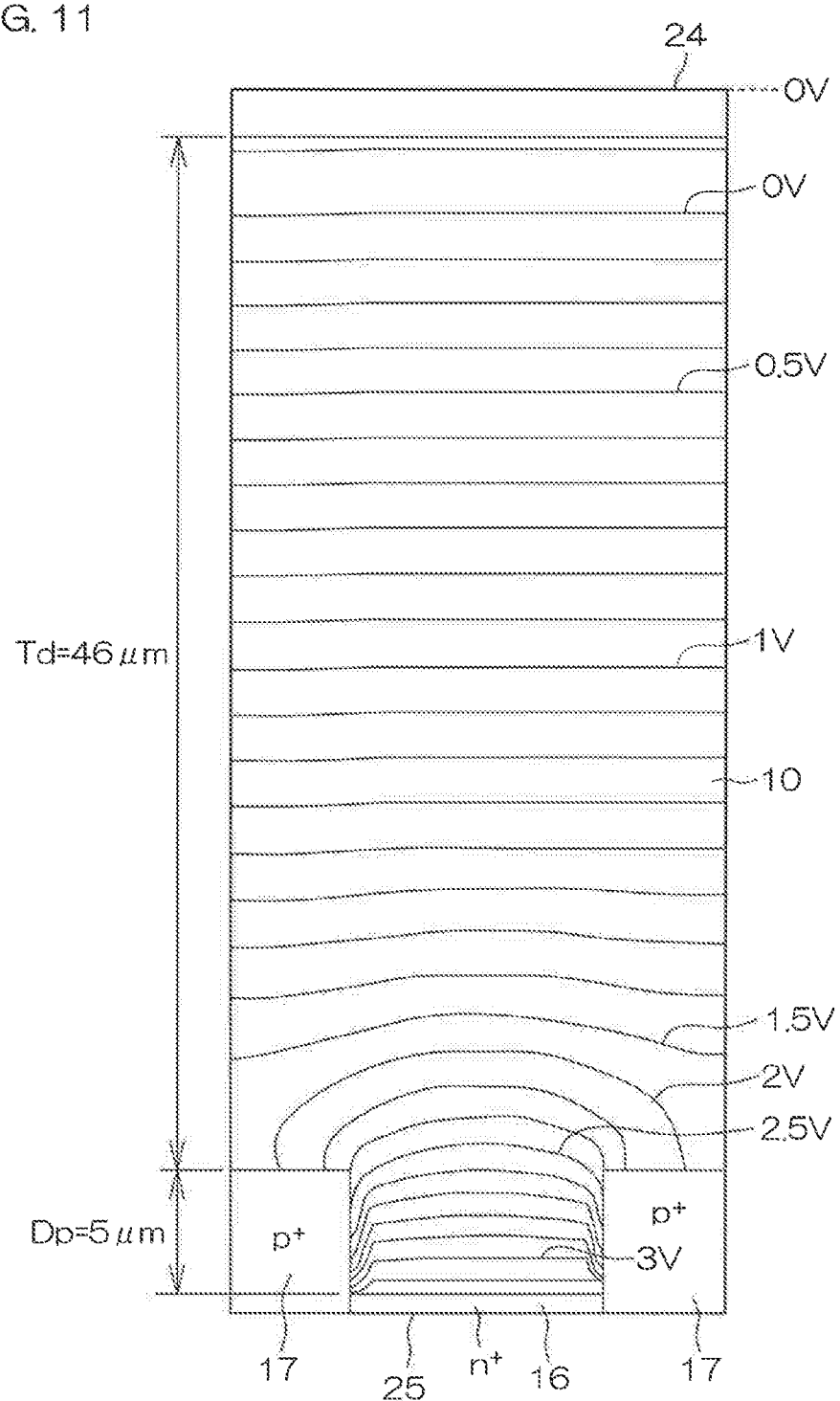
FIG. 11 is a view illustrating the potential distribution of a SiC semiconductor device shown in FIG. 10.

FIG. 11 shows the results of researching the potential distribution of the SiC semiconductor device 2 in the same manner as described previously in FIGS. 4 through 6. FIG.

11 is a view illustrating the potential distribution of the SiC semiconductor device 2 shown in FIG. 10. FIG. 11 shows an example where the y-axis thickness Dp from the upper end of the n⁺ type drain region 16 to the upper end of the p⁺ type collector region 31 is 10 µm.

As shown in FIG. 11, since the upper end of the p⁺ type collector region 31 is positioned closer to the surface of the SiC semiconductor layer 10 than the upper end of the n⁺ type drain region 16, a relatively high equipotential surface expanding from the n⁺ type drain region 16 can be prevented from reaching the upper end of the p⁺ type collector region 31.

A relatively low equipotential surface is distributed over the upper end of the p⁺ type collector region 31. More specifically, an equipotential surface of 1.5 through 2 V is distribute over the upper end of the p⁺ type collector region 31. As such, it can be seen that the potential difference between the p⁺ type collector region 17 and the equipotential surface covering the p⁺ type collector region 17 is greater with reference to the structure previously shown in FIG. 4.

Figure 12:
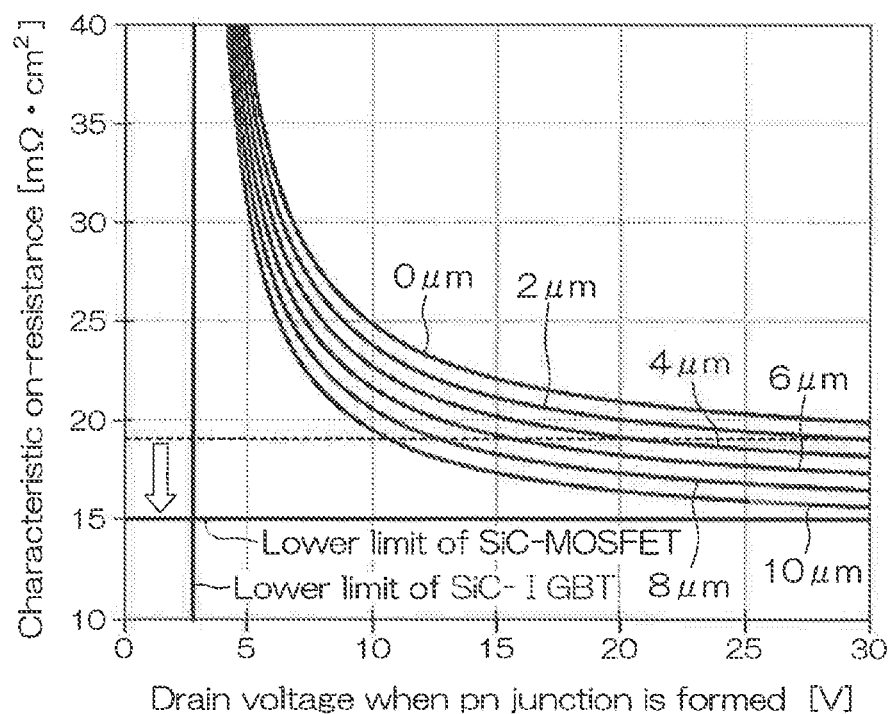
FIG. 12 is a graph illustrating threshold voltage of pn junction vs. characteristic on-resistance of a SiC semiconductor device shown in FIG. 10.

FIG. 12 shows the results of researching the relationship between the threshold voltage of pn junction and the characteristic on-resistance while changing the y-axis thickness Dp from the upper end of the n⁺ type drain region 16 to the upper end of the p⁺ type collector region 31. FIG. 12 is a graph illustrating the threshold voltage of pn junction vs. characteristic on-resistance of a SiC semiconductor device 2 shown in FIG. 10.

The graph illustrated in FIG. 12 shows the results in the case where the y-axis thickness Dp from the upper end of the n⁺ type drain region 16 to the upper end of the p⁺ type collector region 31 is sequentially changed like 0 µm, 2 µm, 4 µm, 6 µm, 8 µm, and 10 µm.

As shown in the graph of FIG. 12, it was found that lower limit of the characteristic on-resistance decreased with an increase in the y-axis thickness Dp in regard to the SiC-MOSFET while the lower limit of the threshold voltage of pn junction stayed the same in regard to the SiC-IGBT.

As described above, according to the SiC semiconductor device 2, since the upper end of the p⁺ type collector region 31 is positioned closer to the surface of the SiC semiconductor layer than the upper end of the n⁺ type drain region 16, the equipotential surface expanding from the n⁺ type drain region 16 can be prevented from reaching the upper end of the p⁺ type collector region 31. Thereby, a relatively high equipotential surface is prevented from being distributed over the p⁺ type collector region 31 while a relatively low equipotential surface can be distributed over the p⁺ type collector region 31. In this case, the potential difference between the p⁺ type collector region 31 and the equipotential surface can be made to approach the threshold voltage of pn junction, the pn junction portion (parasitic diode D) can be turned on with a relatively small increase in drain voltage.

Further, by increasing the thickness from the upper end of the n⁺ type drain region 16 to the upper end of the p⁺ type collector region 31, the characteristics of on-resistance can be improved compared to a case where the n⁺ type drain region 16 and the p⁺ type collector region 31 are made to have the same thickness.

Here, the n⁻ type drift region 19 functions as a breakdown voltage holding layer for maintaining the withstand voltage of device (that is, the withstand voltage of the SiC semiconductor device 2). As such, if the y-axis thickness Dp is made thicker, the y-axis thickness Td of the n⁻ type drift region 19 decreases, and thus the inherent withstand voltage of device possibly fails to work suitably. Here, the inventors conceived of a SiC semiconductor 3 shown in FIG. 13.

Figure 13:
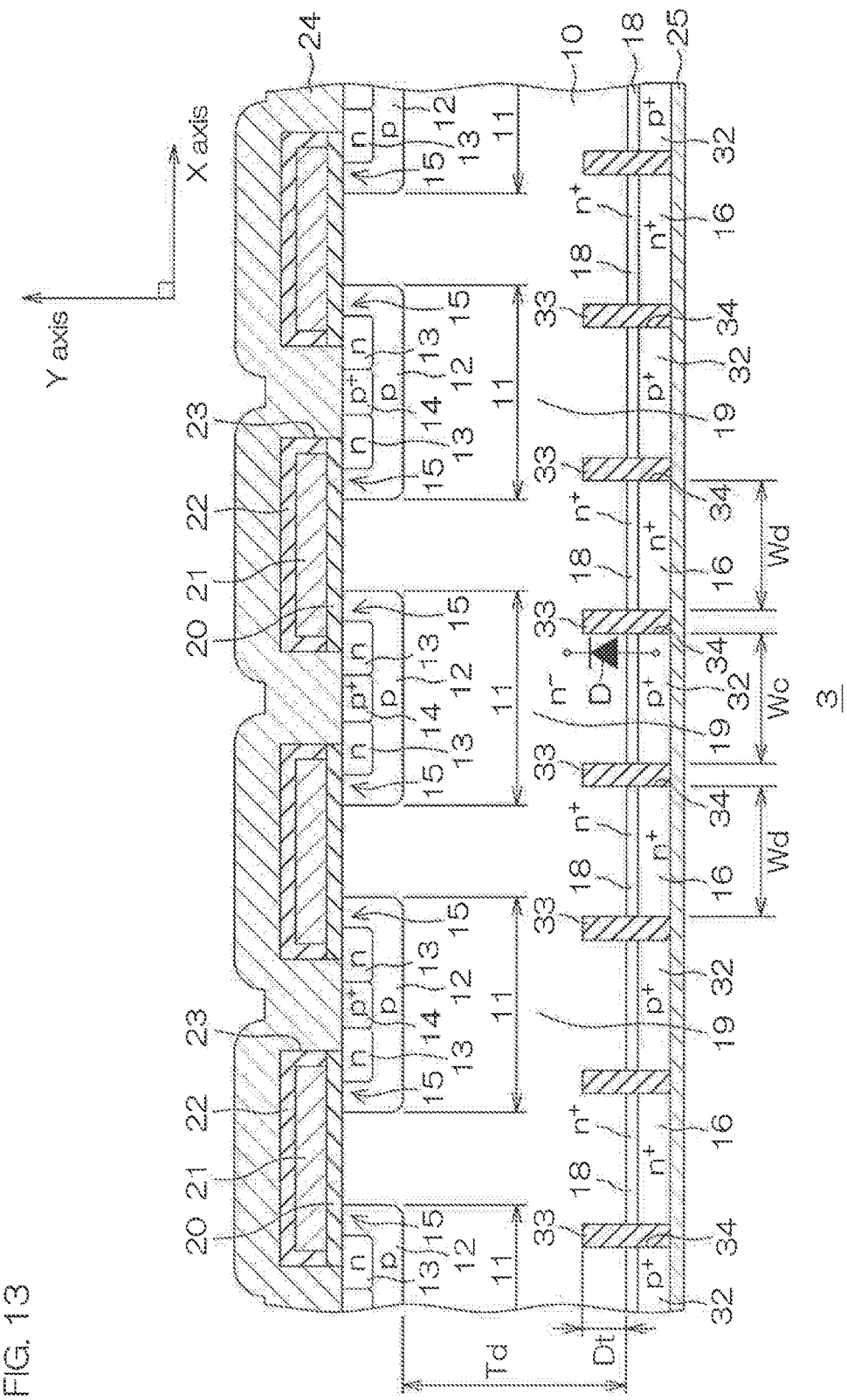
FIG. 13 is a schematic cross-sectional view of a SiC semiconductor device according to an embodiment of the present invention.

FIG. 13 is a schematic cross-sectional view of a SiC semiconductor device 3 according to an embodiment of the present invention.

The SiC semiconductor device 3 is different from the previously described SiC semiconductor device 1 in that a p⁺ type collector region 32 is formed in place of the p⁺ type collector region 17, and that an insulating film 33 is formed in the rear surface portion of the SiC semiconductor layer 10 as an example of the insulating layer according to the present invention. Other components are the same as those shown in the SiC semiconductor device 1. In FIG. 13, the same reference numerals are applied to the components corresponding to each component shown in FIG. 1 previously described and the descriptions for such components will be omitted.

As shown in FIG. 13, p⁺ type collector regions 32 and n⁺ type drain regions 16 are alternately formed spaced apart from each other in the rear surface portion of the SiC semiconductor layer 10.

The p⁺ type collector region 32 is formed right below each unit cell 11 (p-type body region 12), and faces the unit cell 11 across the n⁻ type drift region 19. The x-axis width Wc of the p⁺ type collector region 32 according to this embodiment is, for example 10 µm.

FIG. 13 shows an example where the x-axis width Wc of the p⁺ type collector region 32 is made narrower than the width of the p-type body region 12. The x-axis width Wc of the p⁺ type collector region 32 (the ratio of the area of the p⁺ type collector region 32 to the area of the n⁺ type drain region 16) can be changed in accordance with the y-axis thickness Td of the n⁻ type drift region 19 as necessary. Therefore, when the y-axis thickness Td of the n⁻ type drift region 19 is made thicker, the p⁺ type collector region 32 may be made wider than the width of the p-type body region 12.

Meanwhile, each n⁺ type drain region 16 is formed right below a region between mutually adjacent unit cells 11 (p-type body region 12). The x-axis width Wd of the n⁺ type drain region 16 according to this embodiment is, for example, 10 µm. Further, the upper end of the n⁺ type drain region 16 is positioned at the same depth as the upper end of the p⁺ type collector region 32. The FS region 18 is formed to cover each upper end of the n⁺ type drain region 16 and the p⁺ type collector region 32.

The insulating film 33 is formed in the y-axis direction along the thickness direction of the SiC semiconductor layer 10, and is embedded in an isolation trench 34 between the n⁺ type drain region 16 and the p⁺ type collector region 32. The isolation trench 34 is formed by digging down into the semiconductor layer 10 from the rear surface toward the front surface thereof in the y-axis direction. The isolation trench 34 is formed deeper than the n⁺ type drain region 16 and the p⁺ type collector region 32. A y-axis depth Dt between the upper end of the n⁺ type drain region 16 and the upper end of the isolation trench 34 is, for example, 0 µm through 15 µm (0 µm<y-axis depth Dt≤15 µm, 5 µm in this embodiment). The isolation trench 34 is formed narrower than the x-axis width Wc of the p⁺ type collector region 32 and the x-axis width Wd of the n⁺ type drain region 16.

The insulating film 33 preferably includes an insulating material having the lower dielectric constant than SiC, and the insulating material can be, for example, SiO₂. The insulating film 33 is formed to have the thickness that is the same in size as the depth of the isolation trench 34.

Such an insulating film 33 can be made in the following manner: after forming the n⁺ type drain region 16 and the p⁺ type collector region 32 using the method shown in the previously described embodiment, a hard mask selectively having openings corresponding to the regions where the insulating films 33 are formed is formed on the rear surface of the SiC semiconductor layer 10.

Next, the isolation trench 34 is formed by digging down into the SiC semiconductor layer 10 from the rear surface toward the front surface by etching through the hard mask. Next, the insulating film 33 is formed to cover the rear surface of the SiC semiconductor layer 10 by refilling the isolation trench 34, for example, by CVD method. Thereafter, the unnecessary portions of the insulating film 33 are removed by etch-back. In this way, the insulating film 33 embedded in the isolation trench is formed. A high-resistance layer may be adopted in place of such an insulating film 33.

In relation to a semiconductor layer using SiC, it is known that an originally-nonexistent level exists in a band gap between a conduction band and a valence band due to the existence of point defects (lattice defects) with a given density. Generally, such a level is referred to as a "deep level." The deep level functions as a carrier trapping center (carrier trap), and thus the resistance of a region having point defects (lattice defects) with a relatively high density becomes high.

The high-resistance layer is a region where the resistance becomes higher due to the introduction of such a deep level. The point defects (lattice defects) with a given density are formed in the high-resistance layer by injecting such ions as described later, to thereby form the deep level. The deep level in the high-resistance layer is closer to a midgap level (that is, an intermediate energy between the minimum energy of the conduction band and the maximum energy of the valence band) than a level formed by a dopant in the n$^-$ type drift region 19. The density of the deep level in the high-resistance layer (the density of point defects) is preferably the same (nearly the same) as the density of the impurities (donor) in the n$^-$ type drift region 19 or greater.

Such a high-resistance layer can be made in the following manner: after forming the n$^+$ type drain region 16 and the p$^+$ type collector region 32 using the method shown in the previously described embodiment, a mask selectively having openings corresponding to the regions where the high-resistance layers are formed is formed on the rear surface of the SiC semiconductor layer 10. Then, ion irradiation or electron beam irradiation is carried out.

In the case of ion irradiation, ions of light elements are injected in the SiC semiconductor layer 10 through a mask. Hydrogen ions (proton), helium ions, boron ions and so forth can listed as the ions of light elements. When the ions of light elements are adopted, ions can be injected in positions further deeper than the n$^+$ type drain region 16 and so forth for the SiC semiconductor layer 10 having higher density than a Si semiconductor layer. Thereby, a high-resistance layer with a prescribed y-axis depth Dt (0 μm<y-axis depth Dt≤15 μm, 5 μm in this embodiment) can be easily formed.

On the other hand, when a high-resistance layer is formed by carrying out electron beam irradiation, the SiC semiconductor layer 10 is irradiated with an electron beam through a mask. Although the conditions of electron beam irradiation are different depending on the depth of the high-resistance layer to be formed, for example, the irradiation energy may be 100 keV through 600 keV, and the amount of electron beam irradiation may be $1 \times 10^{15}$ cm$^{-2}$ through $1 \times 10^{18}$ cm$^{-2}$. The electron beam irradiation may be single-stage irradiation carrying out onetime irradiation, or multi-stage irradiation carrying out a plurality of irradiations.

If the high-resistance layer can be formed at the y-axis depth Dt, p-type impurities (boron, aluminum and so forth) or n-type impurities (phosphorus, arsenic and so forth) may be injected into the SiC semiconductor layer 10 in place of ion irradiation or electron beam irradiation. In this case, annealing is carried out to the extent that the impurities are not activated (for example, the activation rate is less than 1%). The region where the impurities are injected in the SiC semiconductor layer 10 becomes a high-resistance SiC provided that the impurities are not activated.

Figure 14:
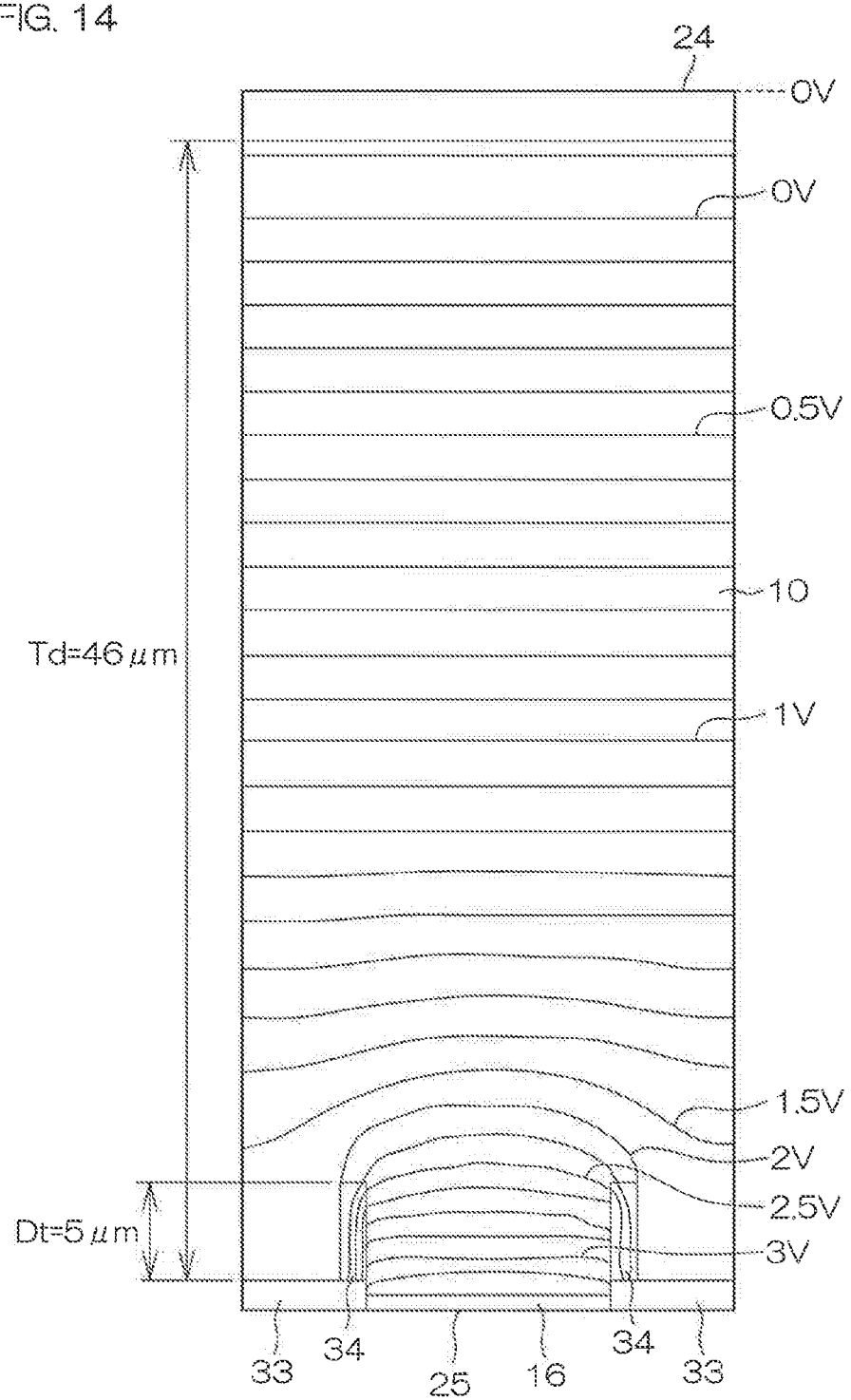
FIG. 14 is a view illustrating the distribution of electrical potential of a semiconductor device shown in FIG. 13.

FIG. 14 shows the results of researching the electrical potential of the SiC semiconductor device 3 in the same manner as previously described in FIGS. 4 through 6. FIG. 14 is a view illustrating the distribution of electrical potential of a semiconductor device 3 shown in FIG. 13.

As shown in FIG. 14, it was found that a relatively high equipotential surface concentrically expanding from the n$^+$ type drain region 16 could be blocked by the insulating film 33 (high-resistance layer) with the insulating film 33 (high-resistance layer) formed between the n$^+$ type drain region 16 and the p$^+$ type collector region 32.

Further, it can be seen that a relatively low equipotential surface is distributed over the upper end of the p$^+$ type collector region 32, because the equipotential surface expanding from the n$^+$ type drain region 16 can be blocked by the insulating film 33 (high-resistance layer). More specifically, an equipotential surface of 1.5 V through 2V is distributed over the p$^+$ type collector region 32. As such, it can be seen that the potential difference between the p$^+$ type collector region 17 and the equipotential surface covering the p$^+$ type collector region 17 is greater with reference to the structure previously shown in FIG. 4. From the results of this simulation, it was found that the same electrical characteristics as the SiC semiconductor device 2 could be achieved according to the SiC semiconductor device 3.

As described above, according to the SiC semiconductor device 3, insulating film 33 (high-resistance layer) is formed between the n$^+$ type drain region 16 and the p$^+$ type collector region 32, and thus a relatively high equipotential surface expanding from the n$^+$ type drain region 16 can be blocked by the insulating film 33 (high-resistance layer). Thereby, a relatively high equipotential surface can be suppressed from being distributed over the p$^+$ type collector region 32 while a relatively low equipotential surface can be distributed over the p$^+$ type collector region 32.

With this configuration, the potential difference between the p$^+$ type collector region 32 and the equipotential surface can be made to approach the threshold voltage of pn junction, and thus the pn junction portion (parasitic diode D) can be turned on with a relatively small increase in drain voltage. In this way, the transfer from a small current region to a large current region can be carried out, and thereby the tradeoff relationship between the characteristics of a small current region and the characteristics of a large current region can be improved. As a result, the SiC semiconductor device 3 excellent in both the characteristics of a small current region and the characteristics of a large current region can be provided.

Further, different from the above-described SiC semiconductor device 2, the y-axis thickness Td in the n$^-$ type drift region 19 between the p$^+$ type collector region 32 and the p-type body region 12 is prevented from being thinner than the thickness of the n$_-$ type drift region 19 between n$^+$ type drain region 16 and the p-type body region 12 in the SiC semiconductor device 3, and thus the decrease in withstand voltage of a device can be effectively suppressed.

Figure 15:
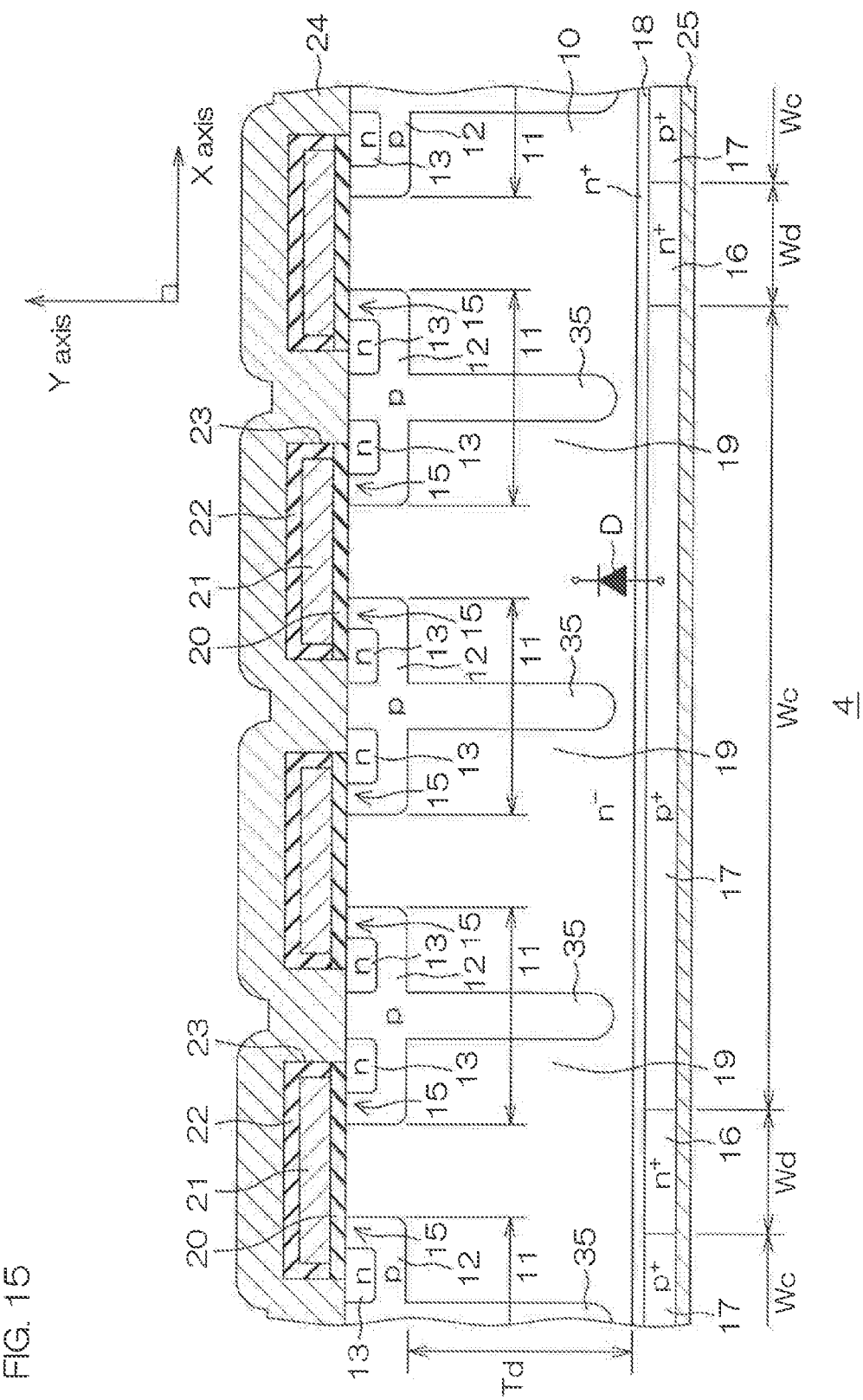
FIG. 15 is a schematic cross-sectional view of a SiC semiconductor device according to an embodiment of the present invention.

FIG. 15 is a schematic cross-sectional view of a SiC semiconductor device 4 according to an embodiment of the present invention.

The SiC semiconductor device 4 is different from the previously described SiC semiconductor device 1 in that a p+ type contact region 14 is not formed, and that a p-type column region 35 is formed below the p-type body region 12. Other components are the same as those shown in the SiC semiconductor device 1. In FIG. 15, the same reference numerals are applied to the components corresponding to each component shown in FIG. 1 previously described and the descriptions for such components will be omitted.

The p-type column region 35 is integrally formed with and extends from the p-type body region 12 in the inner portion from the p-type body region 12. More specifically, the p-type column region 35 is formed to extend from the bottom portion of the p-type body region 12 toward the n− type drift region 19 in the y-axis direction along the thickness direction of the SiC semiconductor layer 10, to thereby forma pn junction with the n_ type drift region 19. The bottom portion of the p-type column region 35 is positioned between the p-type body region 12 and the FS region 18.

As described above, according to the SiC semiconductor device 4, a super junction (SJ) structure is formed in addition to a Hybrid-MOS structure. The SJ structure allows a depletion layer to expand in the direction along the interface between the p-type column region 35 and the n− type drift region 19 (that is in the thickness direction of the n− type drift region 19) throughout the interface. As a result, a local electric field concentration can be prevented in the n− type drift region 19, and thus an on-resistance value can be decreased while improving a withstand voltage.

According to such effects of reducing an on-resistance and improving a withstand voltage, the characteristics of threshold voltage of pn junction vs. characteristic on-resistance shown in previously described FIG. 3 can be further improved. Further, since the characteristics can be improved, the impurity concentration of the n− type drift region 19 can be decreased. Also, the y-axis thickness Td of the n− type drift region 19 can be made thinner. Therefore, the SiC semiconductor device 4 excellent in both the characteristics of a small current region and the characteristics of a large current region while increasing the design flexibility, can be provided.

Figure 16:
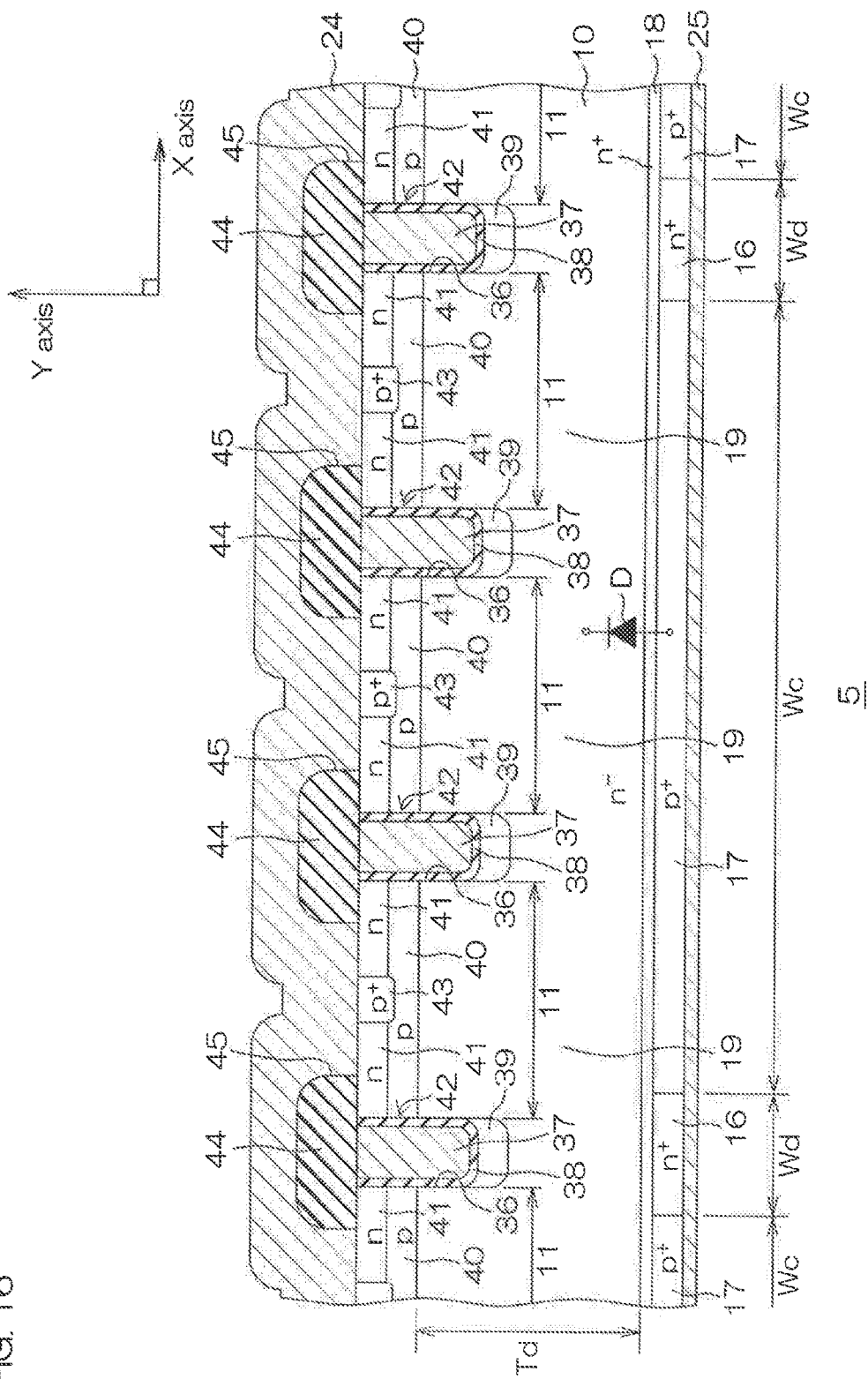
FIG. 16 is a schematic cross-sectional view of a SiC semiconductor device according to an embodiment of the present invention.

FIG. 16 is a schematic cross-sectional view of a SiC semiconductor device 5 according to an embodiment of the present invention.

The SiC semiconductor device 5 is different from the previously described SiC semiconductor device 1 in that a trench-gate structure in which a gate electrode 37 is embedded in a gate trench 36 is formed in place of the gate electrode 21. Other components are the same as those shown in the SiC semiconductor device 1. In FIG. 16, the same reference numerals are applied to the components corresponding to each component shown in FIG. 1 previously described and the descriptions for such components will be omitted.

As shown in FIG. 16, a plurality of gate trenches 36 is formed in the y-axis direction along the thickness direction of the SiC semiconductor layer 10 from the front surface toward the rear surface of the SiC semiconductor layer 10. The bottom portion of each gate trench 36 is positioned at the middle along the thickness direction of the SiC semiconductor layer 10 (n− type drift region 19). The edge portions connecting the lateral surface and the bottom portion of each gate trench 36 are formed in a shape curved outwardly therefrom. Each gate trench 36 is formed into a U-shape in cross-sectional view. The concentration of electric filed on the edge portions can be reduced given that each gate trench 36 has an edge formed into a curved shape.

Each gate trench 36 has the gate electrode 37 embedded therein across a gate insulating film 38. The gate electrode 37 has a surface flush with the surface of the SiC semiconductor layer 10. The materials of the gate electrode 37 and the gate insulating film 38 are the same as those in the previously described embodiment. A p-type body region 40 that defines the unit cell 11 is formed between mutually adjacent gate trenches 36. A p-type region 39 is formed in a region between the bottom portion of each gage trench 36 and the upper end of the FS region 18.

The p-type region 39 is formed along the bottom portion of each gate trench 36. The p-type region 39 covers the edge portion of each gate trench 36, and this p-type region 39 serves to alleviate the electric field concentration at the edge portion of each gate trench 36. The p-type region 39 may be formed spaced apart from the bottom portion of each gate trench 36.

The bottom portion of the p-type body region 40 is positioned between the surface of the SiC semiconductor layer 10 and the bottom portion of the gate trench 36 in the y-axis direction along the thickness direction of the SiC semiconductor layer 10. The end of the p-type body region 40 forms a part of the gate trench 36 in the x-axis direction along the surface of the SiC semiconductor layer 10. That is, the p-type body region 40 is electrically connected to the gate electrode 37 with the gate insulating film 38 interposed therebetween. In this embodiment, the n− type drift region 19 is the region between the p-type body region 40 and the FS region 18. An n-type source region 41 is formed in the inner portion of the p-type body region 40.

The n-type source region 41 is formed shallower than the p-type body region 40 in the y-axis direction along the thickness direction of the SiC semiconductor layer 10. The end of the n-type source region 41 forms a part of the gate trench 36 in the x-axis direction along the surface of the SiC semiconductor layer 10. That is, the n-type source region 41 is electrically connected to the gate electrode 37 with the gate insulating film 38 interposed therebetween. A p-type channel region 42 is a region along the gate trench 36 between the lower end of the n-type source region 41 and the lower end of the p-type body region 40 in the y-axis direction along the thickness direction of the SiC semiconductor layer 10. A p+ type contact region 43 is formed so as to pass through the n-type source region 41.

The p+ type contact region 43 passes through the n-type source region 41, and is formed so as to cross the boundary between the n-type source region 41 and the p-type body region 40. The p+ type contact region 43 has an impurity concentration higher than the p-type body region 40.

An insulating film 44 covering the gate electrode 37 is formed on the SiC semiconductor layer 10. A contact hole 45, which selectively expose a part of the n-type source region 41 and the p+ type contact region 43, is formed in the insulating film 44. The source electrode 24 is electrically connected to the p type body region 40, a part of the n type source region 41, and the p+ type contact region 43 in the contact hole 45.

As described above, according to the SiC semiconductor device 5, a trench-gate structure is formed in addition to the Hybrid-MOS structure. Even with this configuration, the same effects as the effects in the previously described embodiment can be produced.

Figure 17:
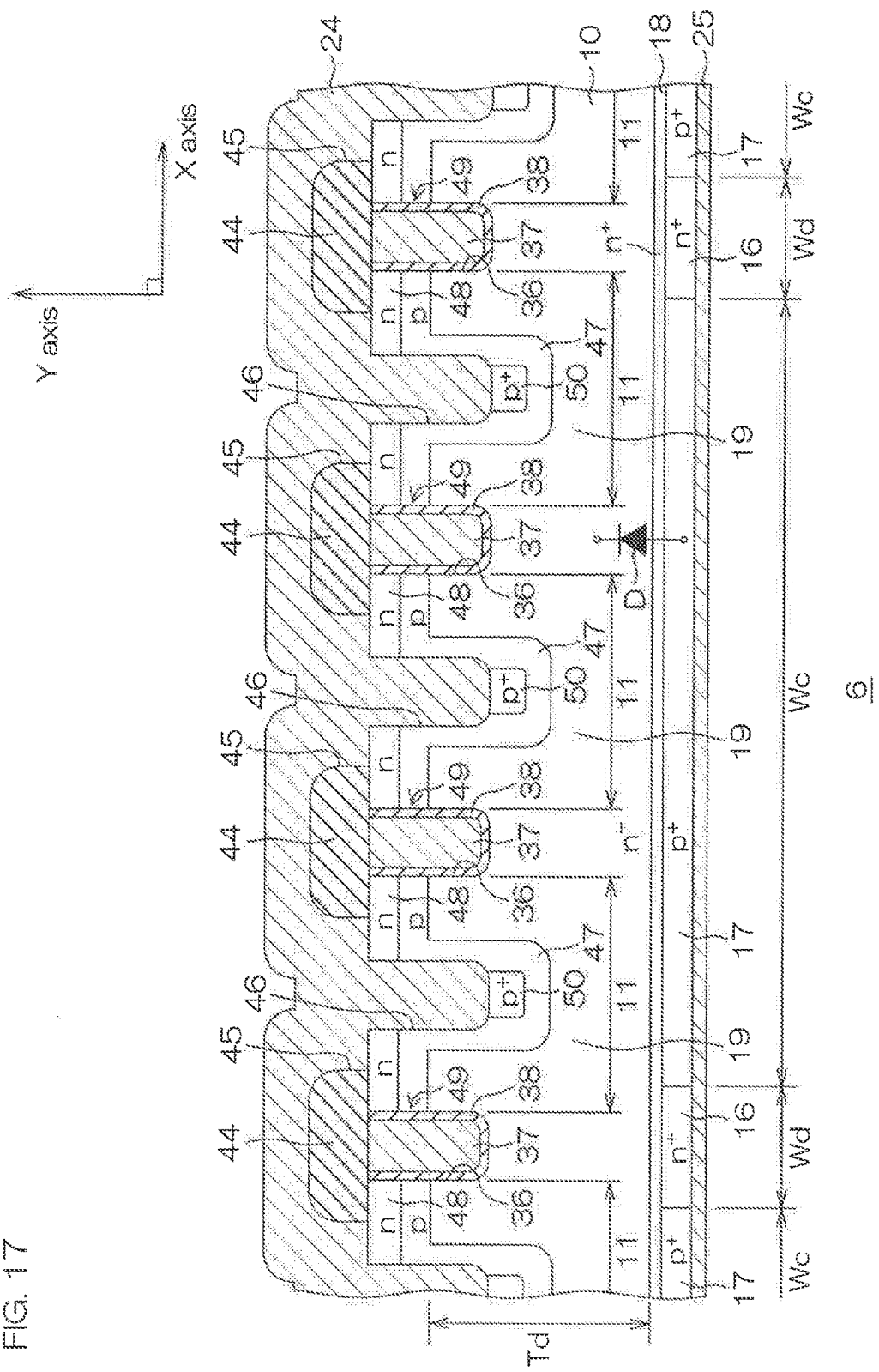
FIG. 17 is a schematic cross-sectional view of a SiC semiconductor device according to an embodiment of the present invention.

FIG. 17 is a schematic cross-sectional view of a SiC semiconductor device 6 according to an embodiment of the present invention.

The SiC semiconductor device 6 is different from the previously described SiC semiconductor device 5 in that a double-trench structure including a source trench 46 is formed in addition to the gate trench 36, that p-type region 39 is not formed at the bottom portion of the gate trench 36, and that a p-type body region 47, an n-type source region 48, and a $p^+$ type contact region 50 are formed in place of the p-type body region 40, the n-type source region 41, and the $p^+$ type contact region 43. Other components are the same as those shown in the SiC semiconductor device 5. In FIG. 17, the same reference numerals are applied to the components corresponding to each component shown in FIG. 16 previously described and the descriptions for such components will be omitted.

As shown in FIG. 17, the source trench 46 is formed at the center of each unit cell 11. A plurality of the source trenches 46 is formed extending from the front surface toward the rear surface of the SiC semiconductor layer 10 in the y-axis direction along the thickness direction of the SiC semiconductor layer 10. The source trench 46 is formed at the same depth as the depth of the gate trench 36. The edge portions connecting the lateral portion and the bottom portion of the source trench 46 are formed in a shape curved outwardly from the source trench 46. The source trench 46 is formed into a U-shape in cross-sectional view. The concentration of electric filed on the edge portions can be alleviated given that the source trench 46 has an edge formed into a curved shape.

The p-type body region 47 is formed along the surface of the SiC semiconductor layer 10, and the lateral portion and the bottom portion of the source trench 46. The p-type body region 47 formed along the lateral portion and the bottom portion of the source trench 46 forms a part of the lateral portion and the bottom portion of the source trench 46. Although FIG. 17 illustrates an example where the p-type body region 47 formed along the lateral portion of the source trench 46 is formed thinner than the p-type body region 47 formed along the bottom portion of the source trench 46, the p-type body region 47 may be formed to have the same thickness.

The n-type source region 48 is formed between the gate trench 36 and the source trench 46 in the surface portion of the SiC semiconductor layer 10. The ends of the n-type source region 48 form a part of the gate trench 36 and a part of the source trench 46 in the x-axis direction along the surface of the SiC semiconductor layer 10. The n-type source region 48 is formed shallower than the p-type body region 47 in the y-axis direction along the thickness direction of the SiC semiconductor layer 10. A p-type channel region 49 is a region between the lower end of the n-type source region 48 and the lower end of the p-type body region 47 along the gate trench 36 in the y-axis direction.

The $p^+$ type contact region 50 formed at the bottom portion of the source trench 46. That is, the $p^+$ type contact region 50 forms a part of the bottom portion of the source trench 46. The bottom portion of the $p^+$ type contact region 50 is positioned between the bottom portion of the source trench 46 and the bottom portion of the p-type body region 47 formed along the bottom portion of the source trench 46.

The source electrode 24 gets into the contact hole 45 from the surface of the insulating film 44 and gets into the source trench 46 from the contact hole 45. The source electrode 24 is electrically connected to the p-type body region 47, the n-type source region 48, and the $p^+$ type contact region 50 in the contact hole 45 and the source trench 46.

As described above, according to the SiC semiconductor device 6, a double trench structure including the gate trench 36 and the source trench 46 is formed in addition to the Hybrid-MOS structure. Even with this configuration, the same effects as the effects in the previously described embodiment can be produced.

Although this embodiment illustrates an example where the p-type region 39 is not formed at the bottom portion of the gate trench 36, the p-type region 39 may be formed at the bottom portion of each gate trench 36 as in the previously described SiC semiconductor device 5. In this case, the p-type region 39 and the $p^+$ type contact region 50 may be formed to have the same concentration at the same depth. With this configuration, the p-type region 39 and the $p^+$ type contact region 50 may be made in the same manufacturing step.

<Planar Shape of $p^+$ Type Collector Region>

Figure 18:
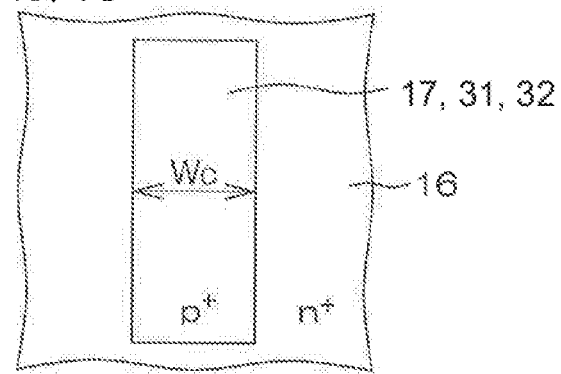
FIG. 18 is a plan view illustrating a planar shape of a collector region.
Figure 19:
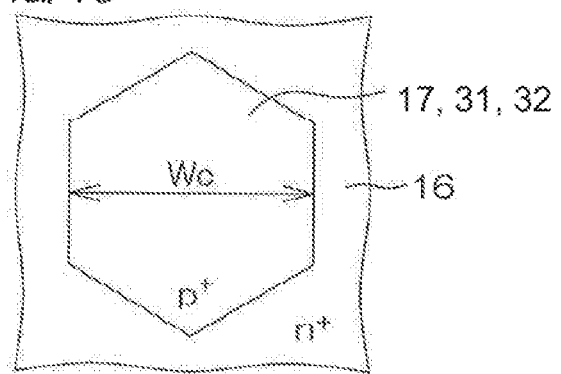
FIG. 19 is a plan view illustrating a planar shape of a collector region.
Figure 20:
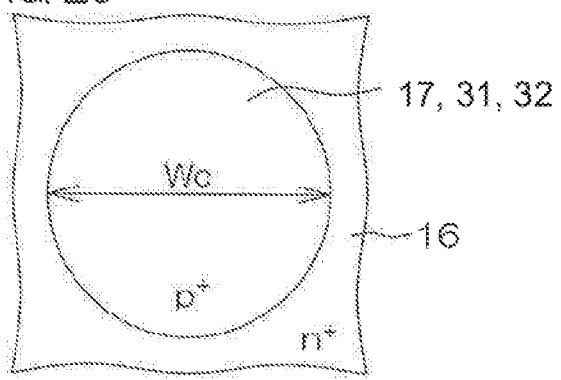
FIG. 20 is a plan view illustrating a planar shape of a collector region.

The $p^+$ type collector regions 17, 31, 32 shown in the previously described SiC semiconductor devices 1 through 6 may have planar shapes as shown in FIGS. 18 through 20. FIGS. 18 through 20 are plan views illustrating the planar shapes of the $p^+$ type collector regions 17, 31, 32 according to the previously described embodiments. The planar shape implies the shape of the $p^+$ type collector regions 17, 31, 32 in plan view when the SiC semiconductor layer 10 is viewed along the normal direction.

As shown in FIG. 18, the $p^+$ type collector regions 17, 31, 32 may be formed in a rectangular shape (striped shape). FIG. 18 shows an example of the rectangular-shaped $p^+$ type collector regions 17, 31, 32. In this case, the x-axis width Wc is defined as the width in the transversal direction.

Further, as shown in FIG. 19, the $p^+$ type collector regions 17, 31, 32 may be formed in a polygonal shape. FIG. 19 shows an example of the hexagonal-shaped $p^+$ type collector regions 17, 31, 32. In this case, the x-axis width Wc is defined as the width of a vertical line connecting two sides. If a vertical line connecting two sides cannot be drawn as in a pentagonal shape, the x-axis width Wc of the $p^+$ type collector regions 17, 31, 32 may be defined by the width of the diagonal line.

Further, as shown in FIG. 20, the $p^+$ type collector regions 17, 31, 32 may be formed in a circular shape. In this case, the x-axis width Wc of the $p^+$ type collector regions 17, 31, 32 may be defined as a diameter of the circle. Of course, the $p^+$ type collector regions 17, 31, 32 may be formed in an elliptical shape. In the case of an elliptical shape, the x-axis width Wc of the $p^+$ type collector regions 17, 31, 32 is defined as the width of the transversal axis.

According to the previously described SiC semiconductor devices 1 through 6, such $p^+$ type collector regions 17, 31, 32 are selectively formed in the rear surface portion of the SiC semiconductor layer 10.

<Layout Examples of $p^+$ Type Collector Regions and $n^+$ Type Drain Regions>

Figure 21:
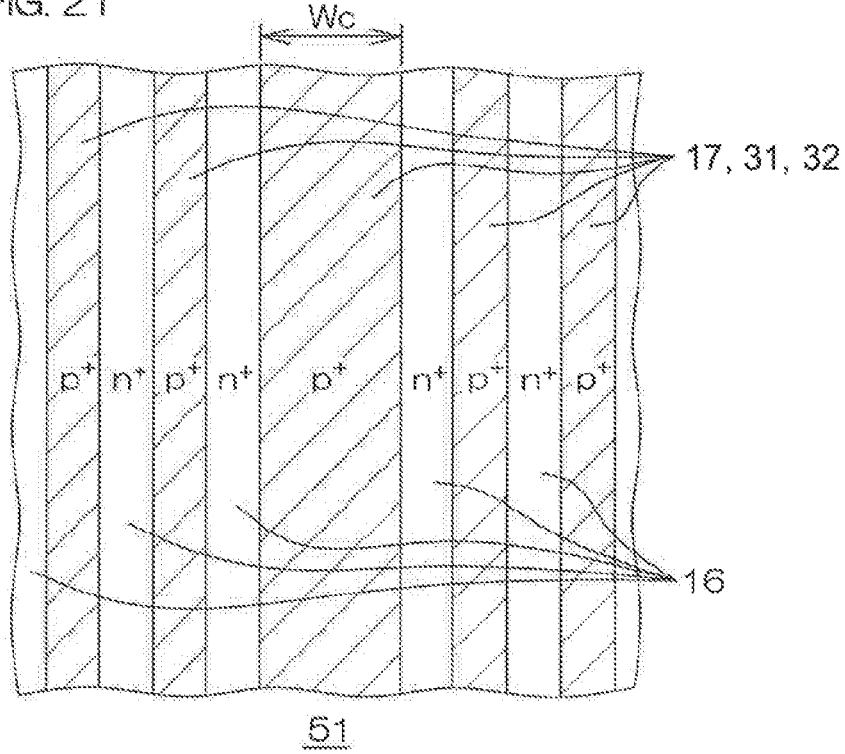
FIG. 21 is a plan view illustrating a layout example of collector regions and drain regions.
Figure 22:
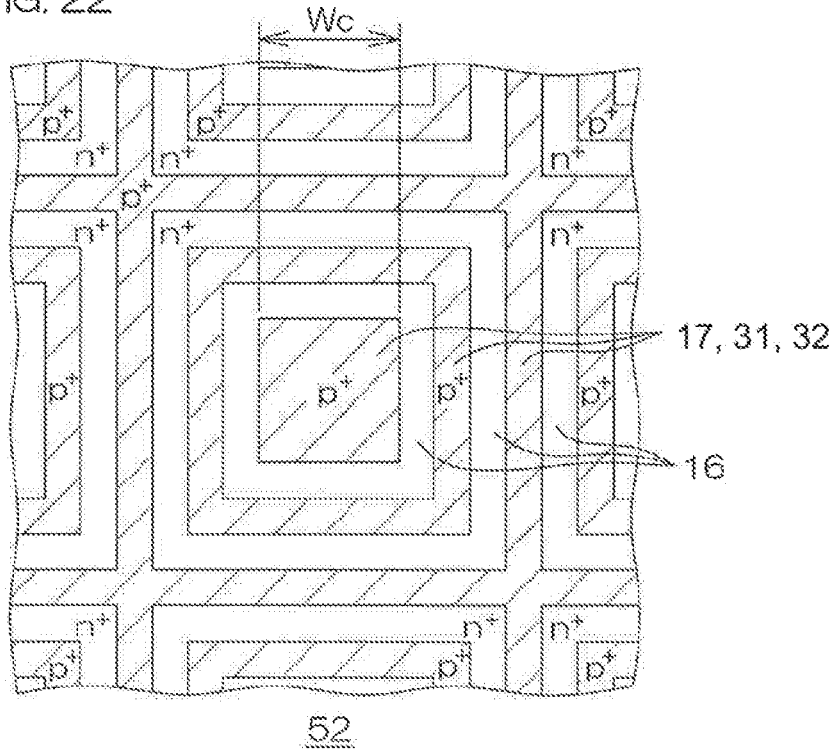
FIG. 22 is a plan view illustrating a layout example of collector regions and drain regions.

Further, the $p^+$ type collector regions 17, 31, 32 and the $n^+$ type drain regions 16 may be laid out as shown in FIGS. 21 and 22. FIGS. 21 and 22 are plan views illustrating layout examples 51, 52 of the $p^+$ type collector regions 17, 31, 32 and the $n^+$ type drain regions 16.

As shown in the layout example 51 of FIG. 21, a plurality of the $p^+$ type collector regions 17, 31, 32 is arrayed in stripes spaced apart from each other. The $n^+$ type drain regions 16 are arrayed in stripes between the mutually adjacent $p^+$ type collector regions 17, 31, 32. The $p^+$ type collector regions 17, 31, 32 selectively include a region formed relatively wide and a region formed relatively narrow compared to the relatively wide region. In this layout example 51, the x-axis width Wc of the p$^+$ type collector regions 17, 31, 32 is defined by the width of a region formed widest from among a plurality of the widths of the p$^+$ type collector regions 17, 31, 32 in a direction orthogonal to the stripe direction.

According to the layout example 52 of FIG. 22, a plurality of the p$^+$ type collector regions 17, 31, 32 rectangular shaped in plan view is arranged in a matrix array. Outwardly from the rectangular-shaped p$^+$ type collector regions 17, 31, 32, an annular rectangular n$^+$ type drain regions 16, an annular rectangular p$^+$ type collector region 17, 31, 32, and another annular rectangular n$^+$ type drain regions 16 are arrayed in this order with the rectangular-shaped p$^+$ type collector regions 17, 31, 32, as the center. A lattice-shaped p$^+$ type collector region 17, 31, 32 is arrayed so as to mark out the n$^+$ type drain regions 16 arrayed outermost from the rectangular-shaped p$^+$ type collector regions 17, 31, 32. In this layout example 52, the x-axis width Wc of the p$^+$ type collector region 17, 31, 32 is defined by the width of the rectangular-shaped p$^+$ type collector regions 17, 31, 32.

According to the layout examples 51, 52, when a prescribed threshold voltage of pn junction is applied to the drain electrode 25 with reference to the source electrode 24, the p$^+$ type collector region 17, 31, 32 formed relatively wide is first turned on. Then, the p$^+$ type collector regions 17, 31, 32 formed relatively narrow are sequentially turned on triggered by the turn-on of the wide-formed p$^+$ type collector region 17, 31, 32.

As such, even when a threshold voltage of pn junction normally not enough to turn on the narrow-formed p$^+$ type collector regions 17, 31, 32 is applied thereto, the narrow-formed p$^+$ type collector regions 17, 31, 32 can be turned on in response to the turn-on of the wide-formed p$^+$ type collector region 17, 31, 32. As a result, characteristics in the threshold voltage of pn junction can be improved.

Although some embodiments of the present invention have been described, other embodiments may also be practiced according to the present invention.

For example, the structures of the SiC semiconductor devices 1 through 6 in each embodiment previously described may be selectively combined. Accordingly, for example, the p$^+$ collector region 17 or the insulating film 33 (high-resistance layer) of the SiC semiconductor devices 2, 3 may be combined with the SiC semiconductor devices 1, 4-6.

Further, although an example in which the n$^+$ drain region 16 is formed right below the region between mutually adjacent unit cells 11 is described in the previously described embodiment, another example in which the n$^+$ drain region 16 is formed outside the region right below the region between mutually adjacent unit cells 11 (for example right below the unit cell 11) may be adopted.

Further, although a previously described embodiment shows an example in which the isolation trench 34 is formed to have the lateral portion orthogonal to the rear surface of the SiC semiconductor layer 10, the isolation trench 34 may be formed to have a trapezoidal shape (tapered shape) in cross-sectional view with the opening width getting narrower from the opening toward the bottom portion. Similarly, the isolation trench 34 may be formed to have a trapezoidal shape (tapered shape) in cross-sectional view with the opening width getting wider from the opening toward the bottom portion. Further, the isolation trench 34 may be formed to have a trapezoidal shape (tapered shape) in cross-sectional view with the opening width getting wider from the opening toward the bottom portion. Further, the isolation trench 34 may be formed to be inclined toward the inner portion of the n$^+$ type drain regions 16 in cross-sectional view. Further, the isolation trench 34 may be formed wider than the x-axis width Wc of the p$^+$ type collector region 32 and/or the x-axis width Wd of the n$^+$ drain region 16 in the x-axis direction along the surface of the SiC semiconductor layer 10.

Further, in the previously described embodiment, the high-resistance layer may be formed to be inclined toward the inner portion of the n$^+$ type drain regions 16 in cross-sectional view. Further, the high-resistance layer may be formed wider than the x-axis width Wc of the p$^+$ type collector region 32 and/or the x-axis width Wd of the n$^+$ drain region 16 in the x-axis direction along the surface of the SiC semiconductor layer 10.

Further, although a previously described embodiment shows an example in which the gate trench 36 and/or the source trench 46 are formed to have the lateral portion orthogonal to the surface of the SiC semiconductor layer 10, the gate trench 36 and/or the source trench 46 may be formed to have a trapezoidal shape (tapered shape) in cross-sectional view with the opening width getting narrower from the opening toward the bottom portion.

Further, a configuration with an inverted conductivity type may be adopted in each previously described embodiment. That is, in each previously described embodiment, a p-type may be replaced by an n-type or an n-type may be replaced by a p-type.

The SiC semiconductor devices 1 through 6 according to the present invention may be incorporated in a power module used in an inverter circuit that forms a drive circuit for driving an electric motor used as a power source for electric cars (hybrid cars included), trains, industrial robots and so forth. Further, the SiC semiconductor devices 1 through 6 may also be incorporated in a power module used in an inverter circuit that converts electric power generated by solar batteries, wind power generators, and other power generating devices (particularly private electric generator) so as to be consistent with electric power from commercial power supply.

It is to be understood that variations and modifications can be made without departing from the scope and spirit of the present invention.

This application corresponds to Patent Application No. 2014-085615 submitted to Japanese Patent Office on Apr. 17, 2014, and the entire contents of this application are hereby incorporated by reference.

DESCRIPTION OF THE REFERENCE NUMERALS

1 SiC semiconductor device
2 SiC semiconductor device
3 SiC semiconductor device
4 SiC semiconductor device
5 SiC semiconductor device
6 SiC semiconductor device
10 SiC semiconductor device
11 Unit cell
12 p-type body region
13 n-type source region
16 n$^+$ drain region
17 p$^+$ collector region
18 Field stop (FS) region
19 n$^-$ type drift region
20 Gate insulating film 21 Gate electrode
31 p⁺ collector region
32 p⁺ collector region
33 Insulating film
36 Gate trench
37 Gate electrode
38 Gate insulating film
40 P-type body region
41 n-type source region
47 P-type body region
48 n-type source region
Td y-axis thickness
Wc x-axis width
Wd x-axis width

What is claimed is:

1. A semiconductor device comprising:
a semiconductor layer of SiC of a first conductivity type;
a body region of a second conductivity type formed in the surface portion of the semiconductor layer;
a source region of the first conductivity type formed in the inner portion of the body region;
a gate electrode facing the body region across a gate insulating film;
a drain region of the first conductivity type and a collector region of the second conductivity type formed in the rear surface portion of the semiconductor layer, the drain region and the collector region adjoining each other; and
a drift region between the body region and the drain region; wherein
the upper end of the collector region is positioned closer to the surface of the semiconductor layer than the upper end of the drain region in the y-axis direction along the thickness direction of the semiconductor layer.

2. A semiconductor device according to claim 1, wherein the rear surface of a semiconductor layer extends across the interface between the drain region and the collector region to make both surfaces flush with each other.

3. A semiconductor device according to claim 1, further comprising:
a field stop region formed to extend over the drain region and the collector region in the x-axis direction along the surface of the semiconductor layer, the field stop region being disposed between the drift region, and the drain region and the collector region.

4. A semiconductor device according to claim 1, wherein the semiconductor device includes a planar-gate structure where the gate electrode is disposed on the semiconductor layer.

5. A semiconductor device according to claim 1, wherein the semiconductor device includes a trench-gate structure where the gate electrode is embedded in a trench formed in the semiconductor layer.

6. A semiconductor device according to claim 1, wherein an x-axis width Wc of the collector region along the surface of the semiconductor layer is made narrower than the width of the body region.

7. A semiconductor device according to claim 1, wherein an x-axis width Wc of the collector region along the surface of the semiconductor layer is made wider than the width of the body region.

8. A semiconductor device according to claim 1, wherein a y-axis thickness Dp from the upper end of the drain region to the upper end of the collector region in the y-axis direction is 0 μm through 10 μm.

9. A semiconductor device according to claim 1, further comprising:
a field stop region formed along the upper end and the lateral part of the collector region, and the upper end of the drain region.

10. A semiconductor device according to claim 3, wherein the field stop region contains an n-type impurity.

11. A semiconductor device according to claim 1, wherein a y-axis thickness Td of the drift region in the y-axis direction along the thickness direction of the semiconductor layer is 10 μm to 100 μm.

* * * * *